(12) United States Patent
Masuda

(10) Patent No.: US 6,201,297 B1
(45) Date of Patent: Mar. 13, 2001

(54) SEMICONDUCTOR DEVICE

(75) Inventor: Masachika Masuda, Tokorozawa (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 09/030,255

(22) Filed: Feb. 25, 1998

(30) Foreign Application Priority Data

Feb. 25, 1997 (JP) .................................................. 9-041263

(51) Int. Cl.$^7$ .................................................. H01L 23/48
(52) U.S. Cl. .................................................. 257/690
(58) Field of Search .................................. 257/696, 691, 257/690

(56) References Cited

U.S. PATENT DOCUMENTS

| | | |
|---|---|---|
| 5,234,866 | 8/1993 | Okinaga et al. . |
| 5,585,665 | * 12/1996 | Anjoh et al. .......................... 257/691 |
| 5,895,969 | * 4/1999 | Masuda et al. ....................... 257/696 |

FOREIGN PATENT DOCUMENTS 5-175406   7/1993  (JP) .

* cited by examiner

*Primary Examiner*—Roy Potter
(74) *Attorney, Agent, or Firm*—Antonelli, Terry, Stout & Kraus, LLP

(57) ABSTRACT

A thin and highly reliable surface-mount-type package is provided for a semiconductor device.

Concretely, the semiconductor device comprises a square semiconductor chip having a plurality of bonding pads formed on the peripheral region on the main surface thereof; a plurality of leads and power source lead, each having an inner lead portion and an outer lead portion; chip-supporting leads for supporting said semiconductor chip; bonding wires for connecting the ends of said inner lead portions to said bonding pads; and a molded resin for sealing said semiconductor chip, said inner lead portions, said bonding wires and said chip-supporting leads; wherein the ends of said inner lead portions are arranged along the outer periphery of said semiconductor chip and are positioned within the thickness of said semiconductor chip in the direction of thickness of said semiconductor chip; said outer lead portions outwardly extend from the side surfaces of said resin sealing member; and portions of said chip-supporting leads are arranged on the main surface of said semiconductor chip and are adhered to the main surface of said semiconductor chip via an insulating adhesive in such a manner that the thickness of said chip-supporting leads is absorbed within the height of wire loops of said bonding wires.

25 Claims, 25 Drawing Sheets

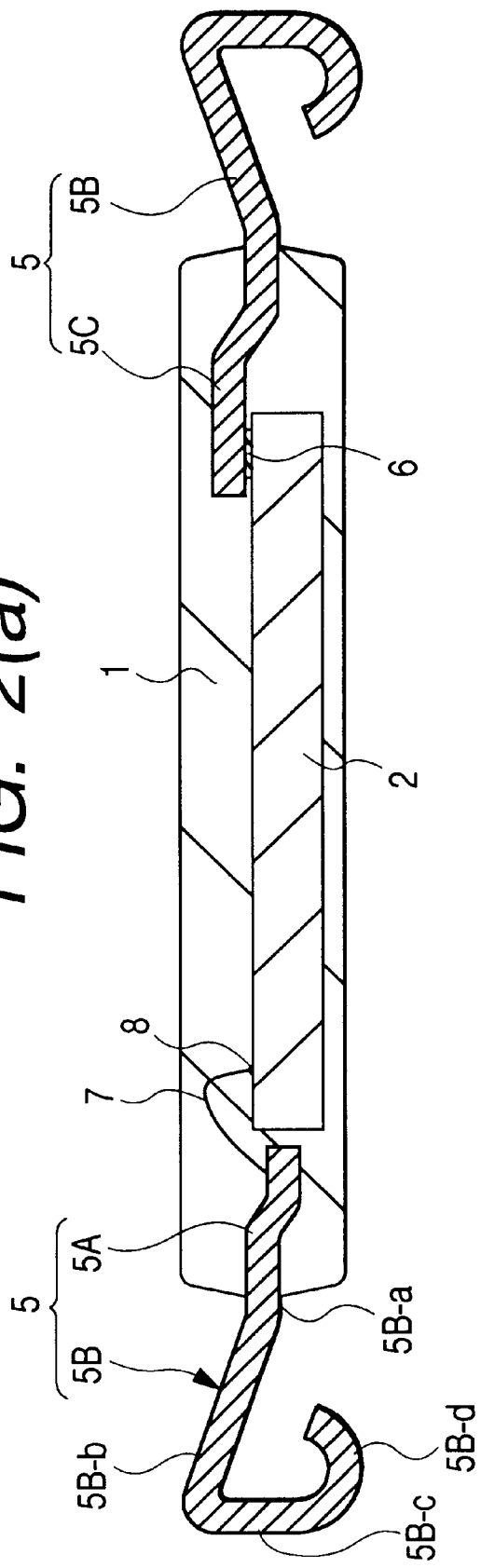
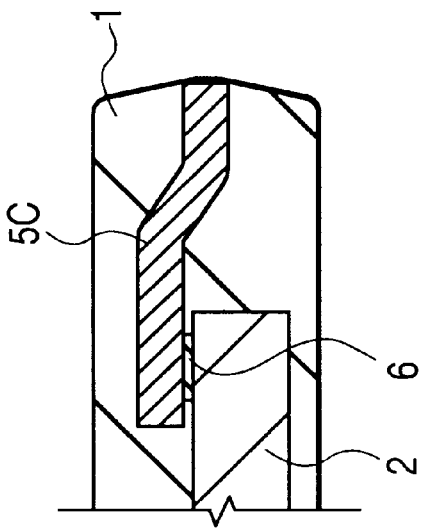

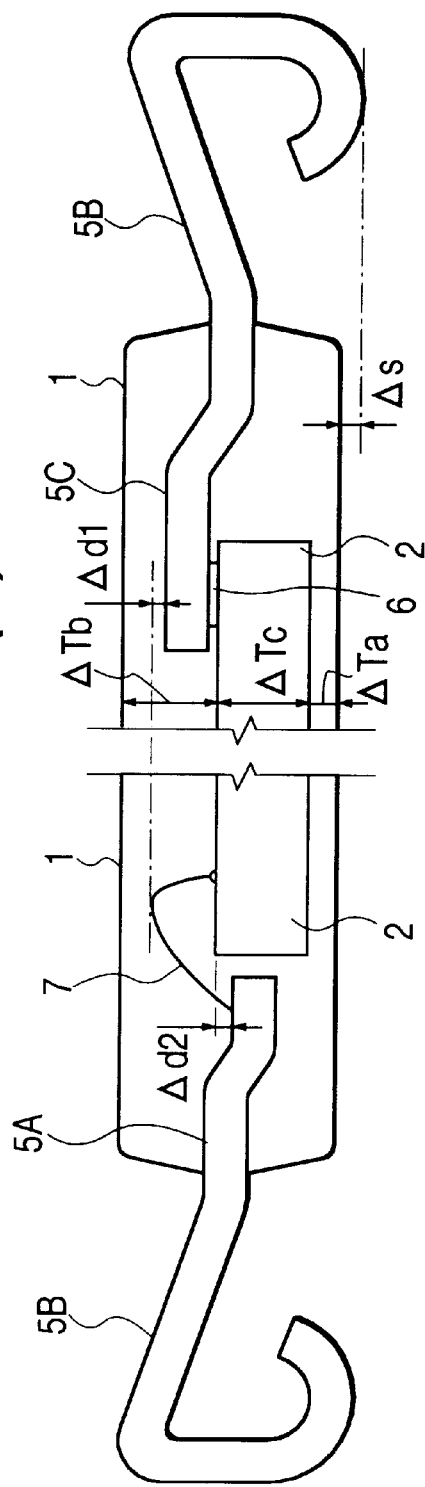
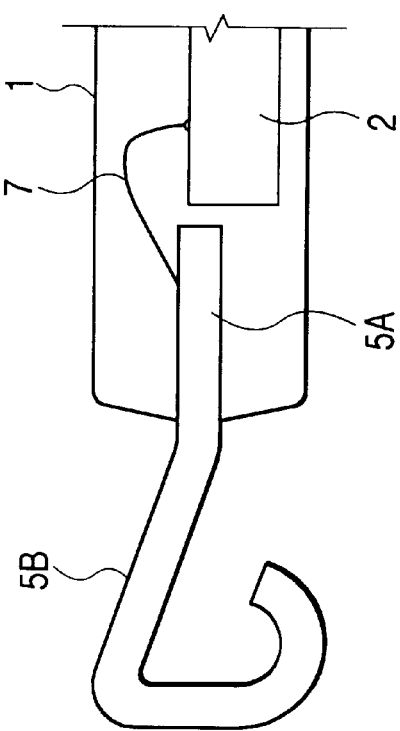
FIG. 3(a)
FIG. 3(b)

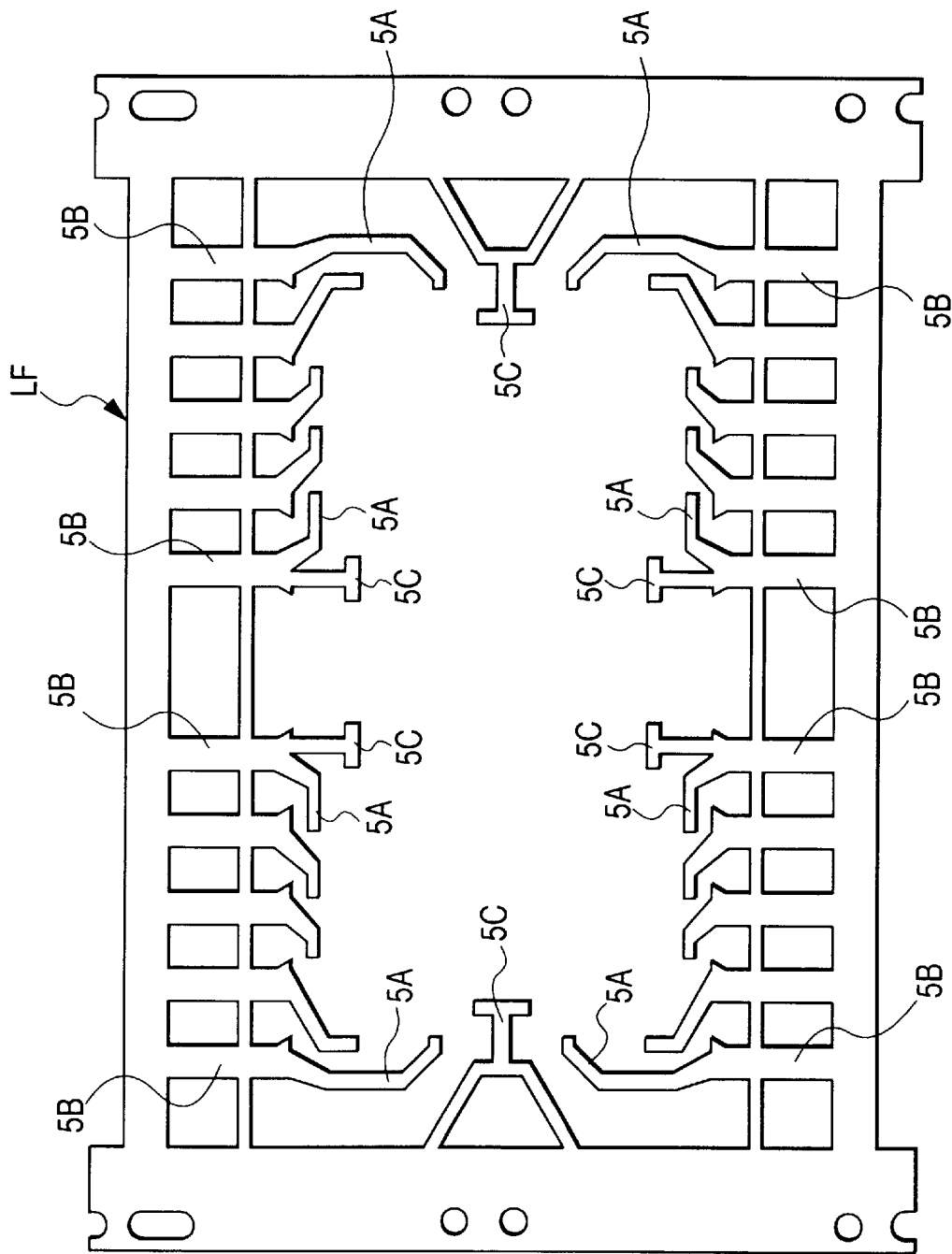

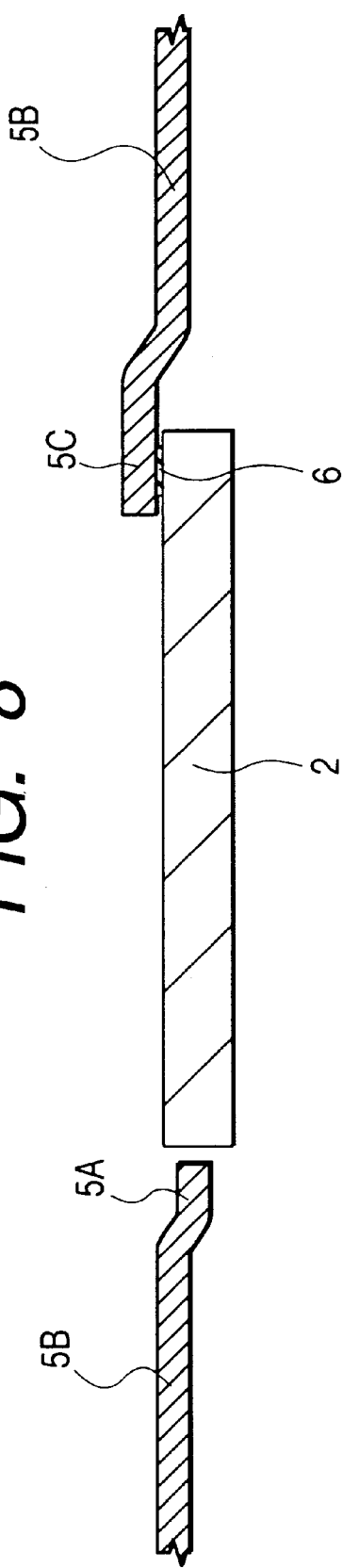
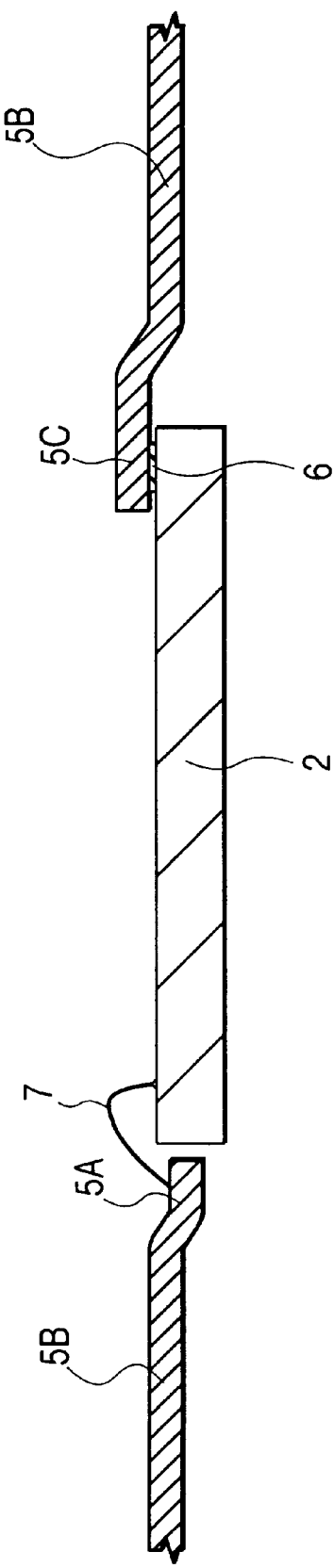

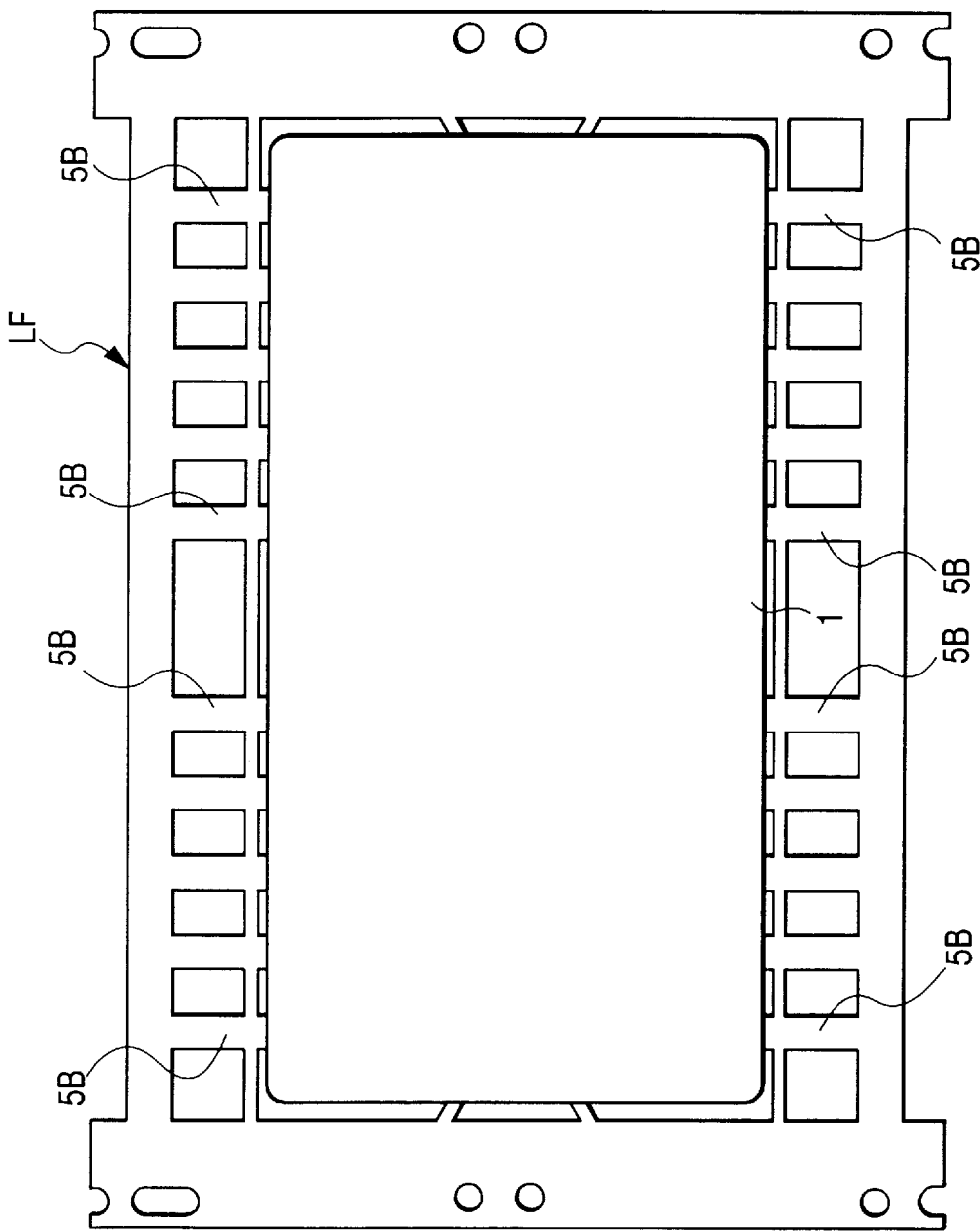

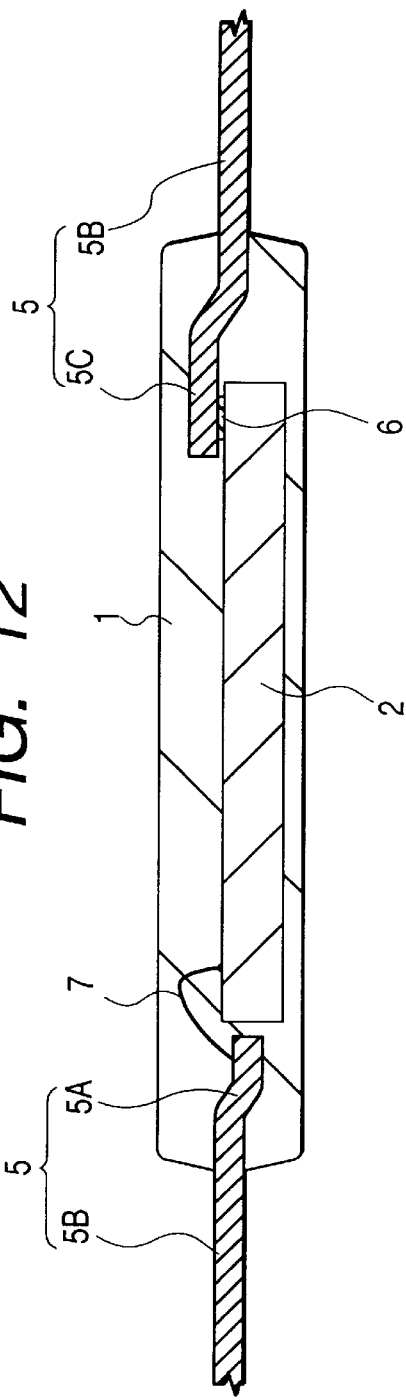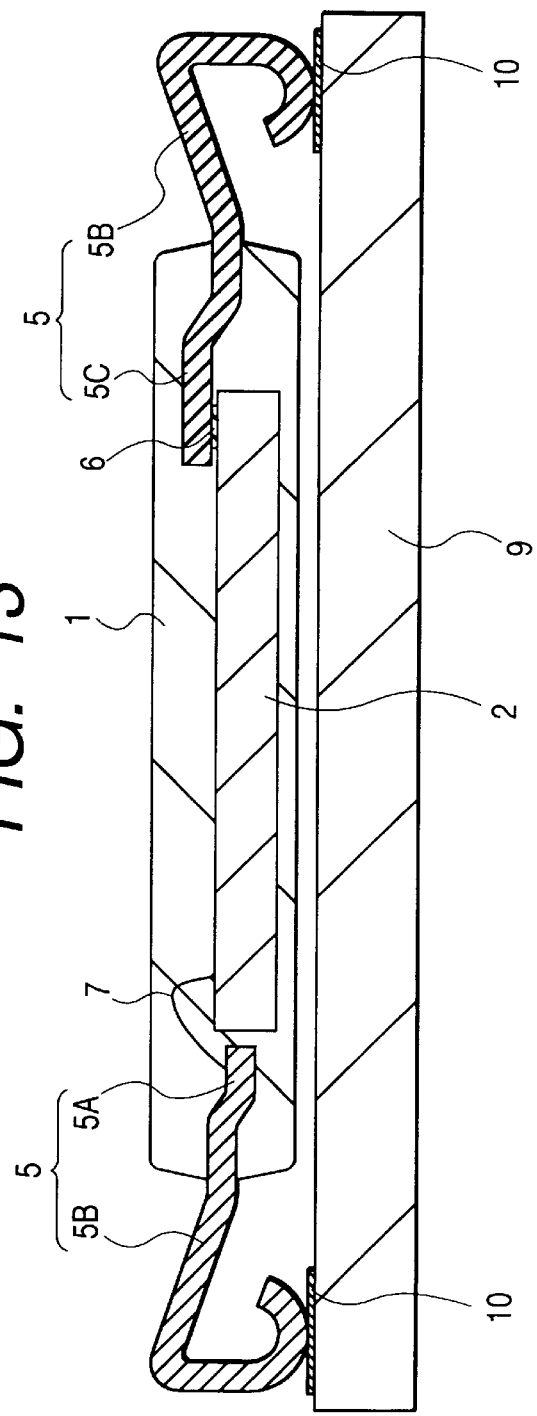

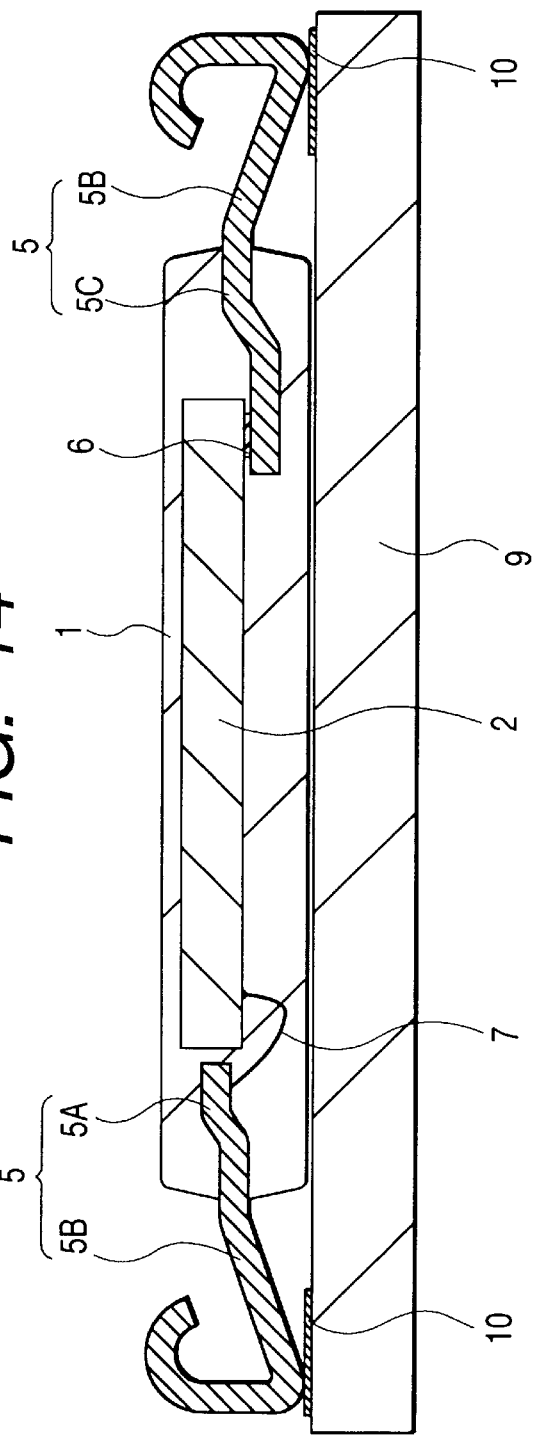
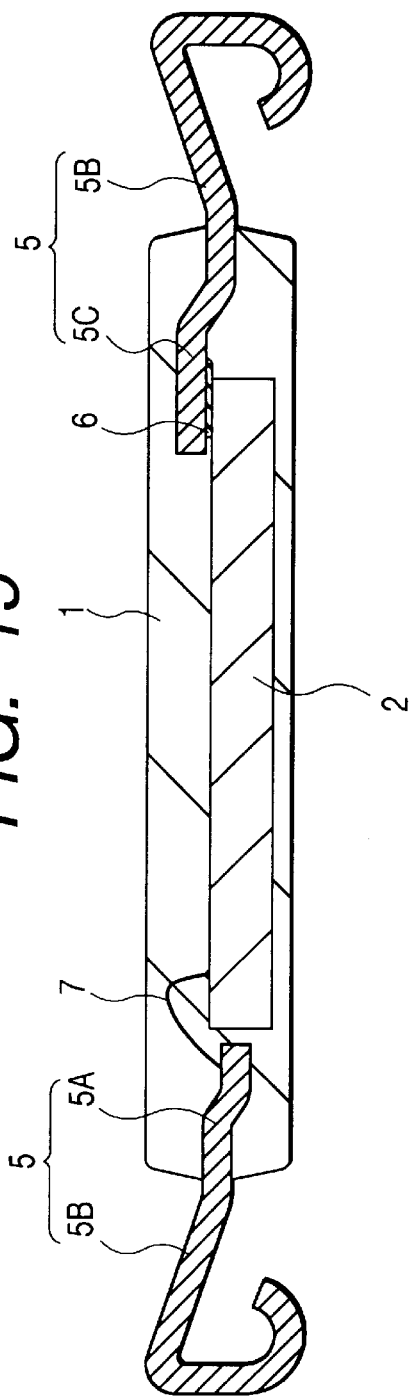

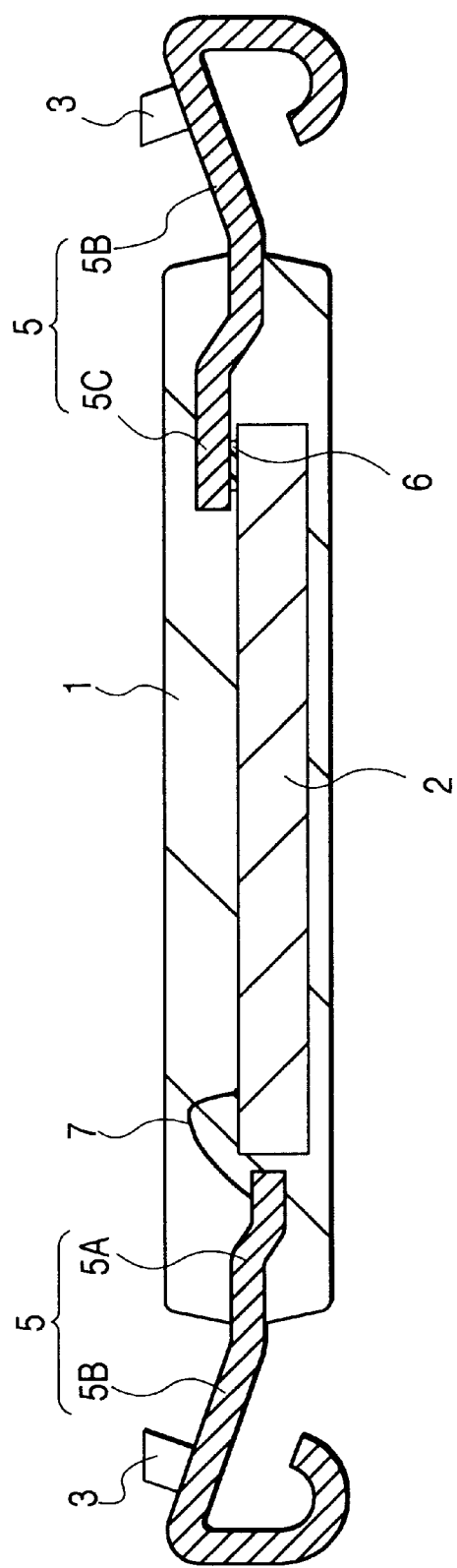

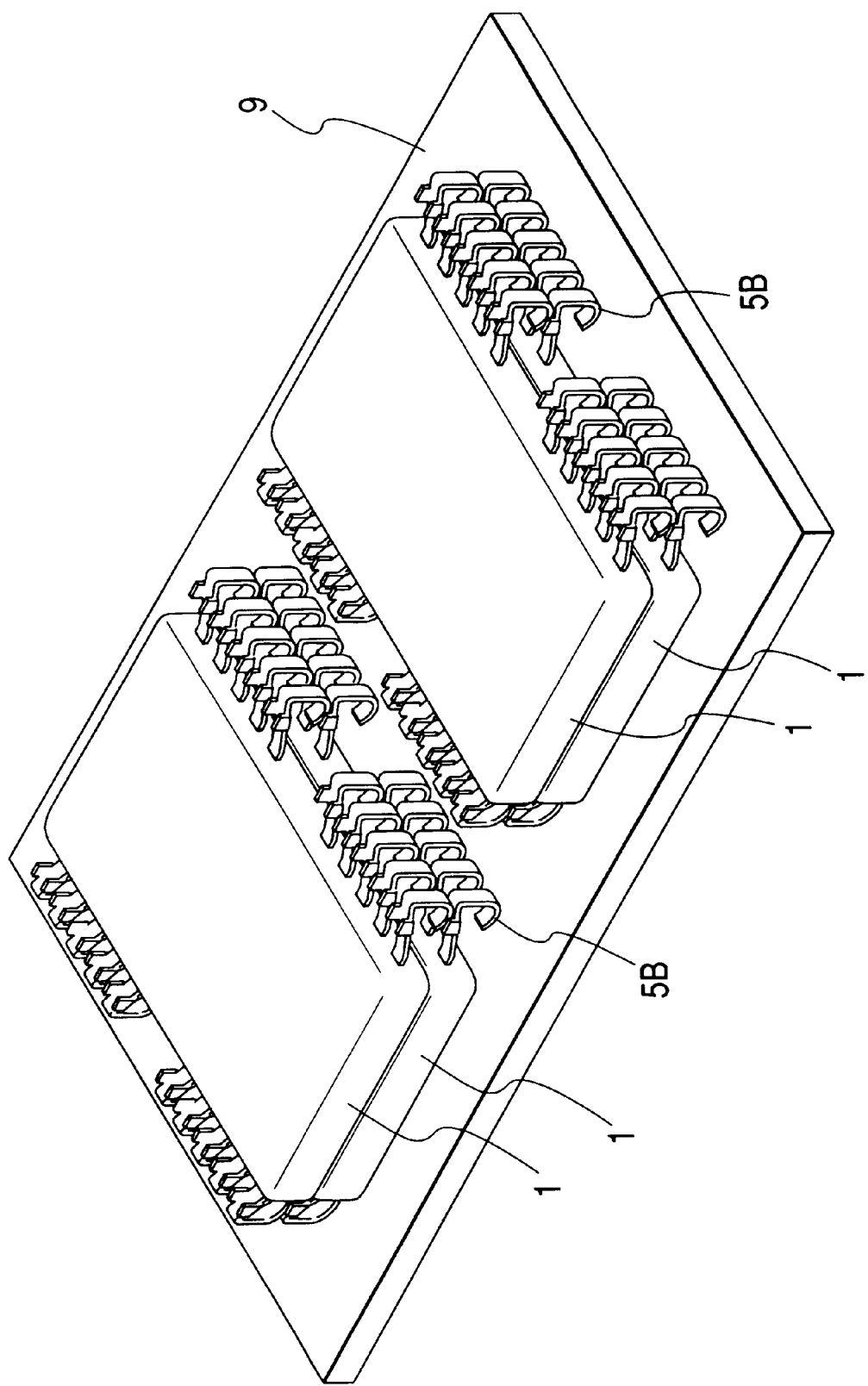

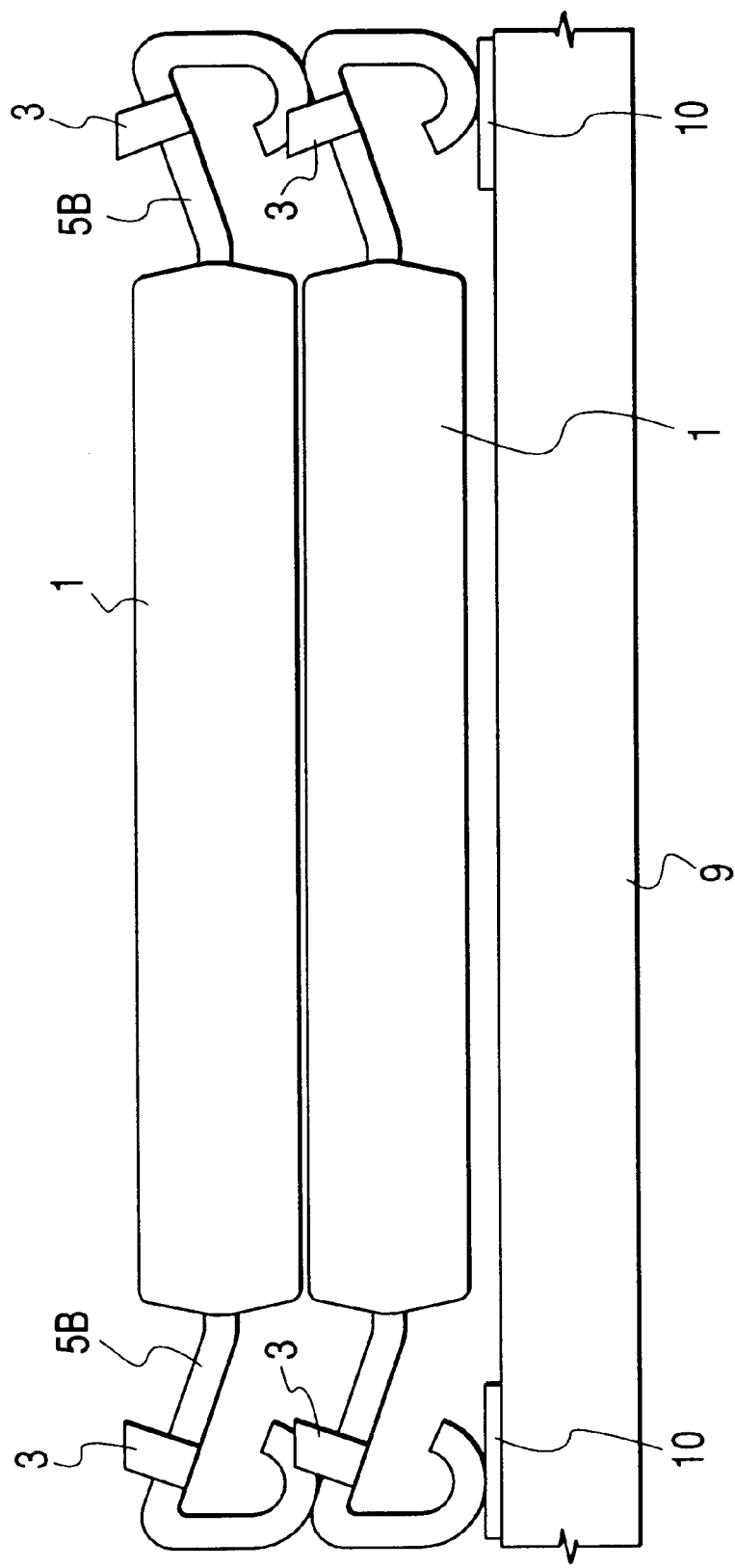

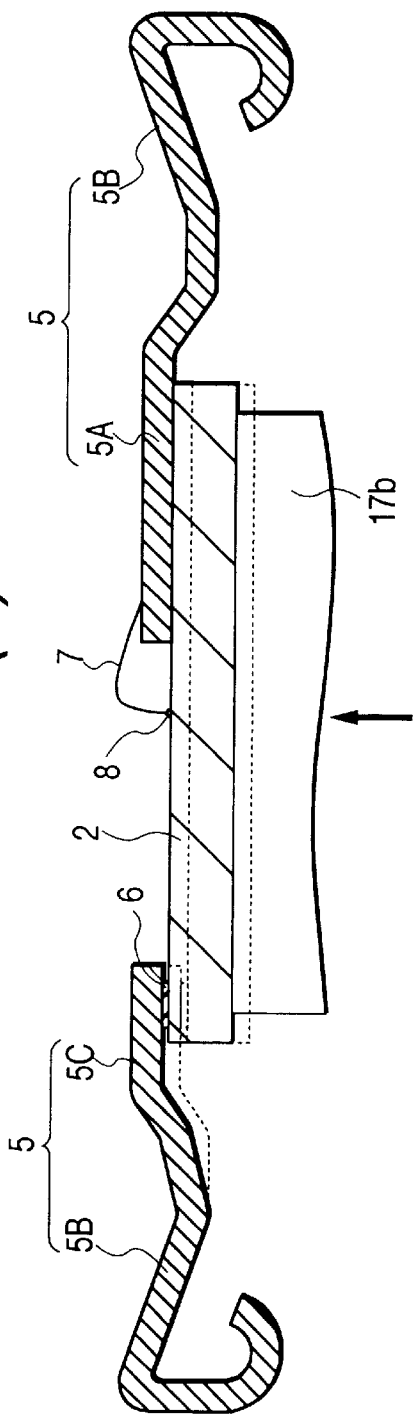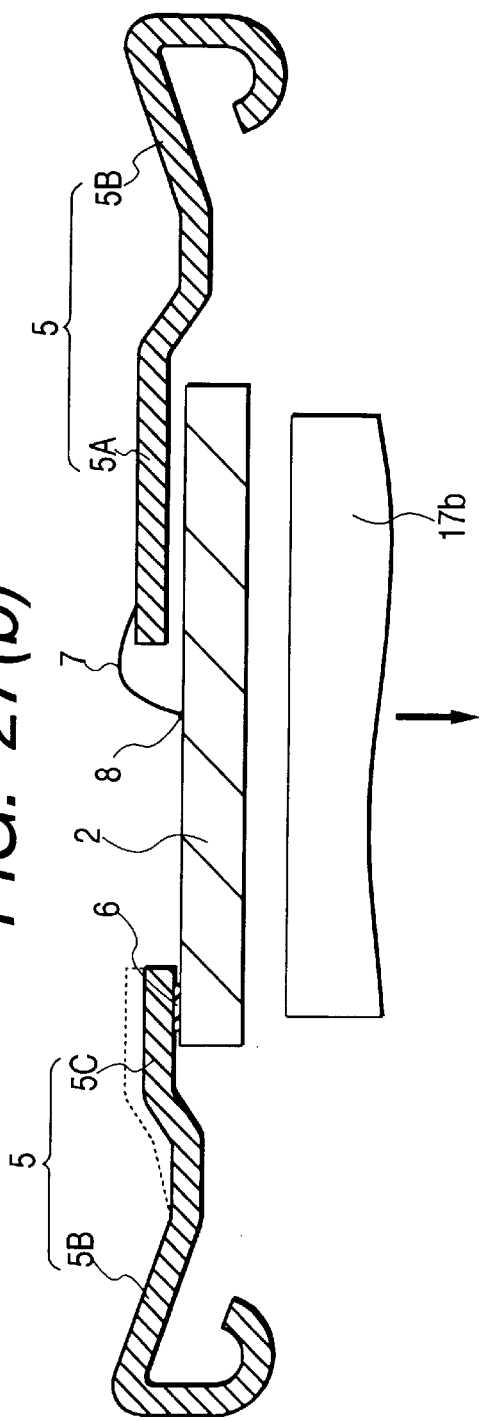

SEMICONDUCTOR DEVICE

BACKGROUND OF THE INVENTION

The present invention relates to a semiconductor device and to a method of producing the same. More particularly, the invention relates to technology effective in decreasing the thickness of a package of the surface mount type.

Modern engineering work stations and personal computers require a memory of a small size, yet a sufficiently large capacity to be capable of processing large amounts of data at high speeds. To meet this requirement, technology has been advanced for laminating packages of the surface mount type.

Decreasing the thickness of the individual surface-mount-type packages is essential for the lamination, and various kinds of thin packages have been developed.

For example, Japanese Patent Laid-Open No. 175406/1993 discloses thin packages, such as a TSOP (thin small outline package) and a TSOJ (Thin Small Outline J-lead package) having a semiconductor chip disposed on a chip-mounting portion (a die pad) of a lead frame, a plurality of leads arranged to surround the semiconductor chip, and a resin sealing member for sealing the inner lead portions of the plurality of leads.

There has further been proposed package having a LOC (load on chip) structure, which is one type of the surface-mount-type packages. This package has a structure in which the inner leads are partly arranged on the main surface (element-forming surface) of a semiconductor chip via an insulating tape, the ends of the inner leads are electrically connected to the bonding pads of the semiconductor chip by bonding the wires, and, then, the semiconductor chip, inner lead portions, insulating tape and bonding wires are sealed with a resin. The insulating tape is constituted by a base film of a heat-resistant resin, such as a polyimide, and an adhesive agent applied to both surfaces thereof. A package having an LOC structure of this type has been disclosed in, for example, U.S. Pat. No. 5,234,866.

SUMMARY OF THE INVENTION

The present inventors have engaged in a study to realize a surface-mount-type package having a further decreased thickness and an increased reliability, and have obtained the results as described below.

In order to prevent short-circuiting among the bonding wires caused by a flow of the wires and to prevent the appearance from becoming poor as a result of a deviated positioning of the semiconductor chip, a thin package, such as the above-mentioned TSOP and the like, have supporting leads and a chip-mounting portion (a die pad) formed integrally with the supporting leads in order to support or secure the semiconductor chip in position in the step of production, such as in the step of sealing with resin. The chip-mounting portion is arranged on the back surface of the semiconductor chip and, hence, the thickness of the surface-mount-type package increases by an amount corresponding to the thickness of the chip-mounting portion.

It is therefore difficult to provide a surface-mount-type package which maintains a high reliability, and yet has a decreased thickness.

The package of the above-mentioned LOC structure has no chip-mounting portion, unlike the above-mentioned TSOP, but has leads that are superposed on the main surface of the semiconductor chip due to its structure. Therefore, this surface-mount-type package has a thickness that is increased by an amount that corresponds to the thickness of the leads. Besides, the base film of the insulating film interposed between the semiconductor chip and the inner lead portions has a thickness of, for example, about 50 Wm, making it difficult to decrease the thickness of the package.

Moreover, the height of the loops of the bonding wires adds to the thickness of the insulating tape, resulting in an increase in the thickness of the surface-mount-type package.

When a lamination-type memory module is produced by using a packages of the LOC structure, too, it becomes difficult to decrease the thickness of the memory module for the same reasons as described above.

Moreover, the base film occupies a relatively large area in the package. Therefore, there is a likelihood that the base film will absorb moisture in the sealing resin and cause the sealing resin to be reflow-cracked.

It is further desired to decrease the cost of the semiconductor device. However, the insulating tape is generally expensive and becomes a factor contributing to an increase in the cost of the semiconductor device.

It is an object of the present invention to provide technology for decreasing the thickness of a surface-mount-type package.

Another object of the present invention is to provide technology for producing a surface-mount-type package at a decreased cost.

A further object of the present invention is to provide technology for improving the reliability and production yield of a surface-mount-type package.

A still further object of the present invention is to provide technology for decreasing the thickness of a lamination-type memory module by using surface-mount-type packages.

A yet further object of the present invention is to provide technology for decreasing the thickness of an IC card on which a surface-mount-type package is mounted.

Representative examples of the present invention are briefly described below.

A semiconductor device according to the present invention comprises:

a semiconductor chip having bonding pads formed on the main surface thereof;

a plurality of leads, each having an inner lead portion and an outer lead portion;

chip-supporting leads;

bonding wires for connecting the ends of said inner leads to said bonding pads; and a resin sealing member for sealing said semiconductor chip, said inner lead portions, said bonding wires and said chip-supporting leads; wherein the ends of said inner lead portions are arranged along the outer periphery of said semiconductor chip and are positioned within the thickness of said semiconductor chip in the direction of thickness of said semiconductor chip;

said outer lead portions outwardly extend from the side surfaces of said resin sealing member; and portions of said chip-supporting leads are arranged on the main surface of said semiconductor chip and are adhered to the main surface of said semiconductor chip via an adhesive.

Furthermore, the semiconductor device of the present invention comprises:

a mounting substrate on which are formed a plurality of wirings;

a first surface-mount-type package disposed on aid mounting substrate; and a second surface-mount-type package laminated on said first surface-mount-type package; wherein each of said first and second surface-mount-type packages comprises:

a semiconductor chip having bonding pads formed on the main surface thereof;

a plurality of leads, each having an inner lead portion and an outer lead portion;

chip-supporting leads;

bonding wires for connecting the ends of said inner lead portions to said bonding pads; and a resin sealing member for sealing said semiconductor chip, said inner lead portions, said bonding wires and said chip-supporting leads; wherein the ends of said inner lead portions are arranged along the outer periphery of said semiconductor chip and are positioned within the thickness of said semiconductor chip in the direction of thickness of said semiconductor chip;

said outer lead portions outwardly extend from the side surfaces of said resin sealing member;

portions of said chip-supporting leads are arranged on the main surface of said semiconductor chip and are adhered to the main surface of said semiconductor chip via an adhesive; and the corresponding outer lead portions of said first and second surface-mount-type packages are electrically connected together.

A method of producing a semiconductor device according to the present invention comprises the steps of:

a) preparing a semiconductor chip having bonding pads formed on the main surface thereof;

b) preparing a lead frame having an outer frame, a plurality of leads, each having an inner lead portion and an outer lead portion, and chip-supporting leads, said plurality of leads and said chip-supporting leads being formed integrally with said outer frame;

c) arranging the ends of said inner lead portions along the outer periphery of said semiconductor chip, arranging the ends of said inner lead portions within the thickness of said semiconductor chip in the direction of thickness of said semiconductor chip, and arranging portions of said chip-supporting leads on the main surface of said semiconductor chip;

d) adhering portions of said chip-supporting leads onto the main surface of said semiconductor chip via an adhesive;

e) connecting the ends of said inner lead portions to said bonding pads by bonding wires;

f) sealing said semiconductor chip, said inner lead portions, said bonding wires and portions of said chip-supporting leads with a resin sealing member; and g) cutting said chip-supporting leads between said resin sealing member and the outer frame of said lead frame.

(1) If concretely described, the semiconductor device of the invention comprises a semiconductor chip having bonding pads formed on the main surface thereof, leads each having an inner lead portion, an outer lead portion and a support lead portion, and a package body in which the semiconductor chip, inner lead portions and support lead portions are sealed, the inner lead portions being arranged along the outer periphery of the semiconductor chip and being connected to the bonding pads via wires, and the outer lead portions outwardly extending from the side surfaces of the package body, wherein the support lead portions are sealed in the package body and portions thereof are arranged on the main surface of the semiconductor chip via an electrically non-conducting adhesive that includes no base film.

According to such a semiconductor device, the semiconductor chip is adhered onto the support lead portions, making it possible to abolish base members, such as tabs or islands, for mounting the semiconductor chip. Therefore, the thicknesses occupied by such base members can be neglected, and the thickness of the package of the semiconductor device can be decreased.

Moreover, since the semiconductor chip is adhered to the support lead portions with an electrically nonconducting adhesive including no base film, the thickness can be decreased by an amount corresponding to the thickness of the base film, making it possible to decrease the thickness of the package of the semiconductor device. Besides, moisture is not absorbed by the base film, the molded resin exhibits enhanced resistance against reflow, and the semiconductor device exhibits improved reliability.

Furthermore, since no expensive base film is used, the semiconductor device is obtained at a decreased cost.

In the semiconductor device of the present invention, the height of the supporting leads on the side of the main surface of the semiconductor chip does not exceed a maximum height of the wires.

According to this semiconductor device, the required thickness of the molding resin on the side of the main surface of the semiconductor chip is determined solely by the maximum height of the wires, and there is no need to take into consideration the thickness of the support lead portions.

According to the semiconductor device of the present invention, furthermore, the points where the wires are connected on the surfaces of the inner lead portions are not higher than the height of the main surface of the semiconductor chip in the direction of thickness of the semiconductor chip, or at least, the lower surfaces of the inner lead portions to where the wires are to be connected are arranged on the side lower than the main surface of the semiconductor chip.

In this semiconductor device, the points where the wires are connected on the surfaces of the inner lead portions are not higher than the height of the main surface of the semiconductor chip in the direction of thickness of the semiconductor chip, or are set at positions lower than a total of the thickness of the semiconductor chip and of the thickness of the inner lead portions, making it possible to lower the height of the wires. In the semiconductor device of the present invention as described above, the required thickness of the molding resin on the side of the main surface of the semiconductor chip is defined by the maximum height of the wires. By decreasing the height of the wires, therefore, it is possible to decrease the thickness of the semiconductor device.

Such a constitution is realized upon arranging the inner lead portions around the semiconductor chip.

(2) The semiconductor device of the invention comprises a semiconductor chip having bonding pads formed on the main surface thereof, leads each having an inner lead portion, an outer lead portion and a support lead portion, and a package body in which the semiconductor chip, inner lead portions and support lead portions are sealed, the inner lead portions being arranged on the main surface of the semiconductor chip and being connected to the bonding pads via wires, and the outer lead portions outwardly extending from the side surfaces of the package body, wherein the support lead portions are sealed in the package body and portions thereof are arranged on the main surface of the semiconductor chip via an electrically nonconducting adhesive that includes no base film.

This semiconductor device is different from the semiconductor device described in (1) above in regard to the fact that the inner lead portions are not arranged around the semiconductor chip, but are arranged on the main surface of the semiconductor chip. The thickness of the semiconductor device is increased by the thickness of the inner lead portions. However, this constitution can be used even when the bonding pads are arranged on the central portion of the semiconductor chip.

Furthermore, the semiconductor chip is adhered onto the support lead portions, making it possible to abolish base members, such as tabs or islands, for mounting the semiconductor chip. Therefore, the thicknesses occupied by such base members can be eliminated, and the thickness of the package of the semiconductor device can be decreased. Moreover, since the semiconductor chip is adhered to the support lead portions with an electrically nonconducting adhesive including no base film, the thickness can be decreased by an amount corresponding to the thickness of the base film, making it possible to decrease the thickness of the package of the semiconductor device. Besides, moisture is not absorbed by the base film, the molded resin exhibits enhanced resistance against reflow, and the semiconductor device exhibits improved reliability. Furthermore, since no expensive base film is used, the semiconductor device is obtained at a decreased cost, just like the semiconductor device described in (1) above.

In the semiconductor device of this invention, the inner lead portions and the bonding pads can be connected together through wires or bump electrodes.

(3) The semiconductor device of the present invention is as described in (1) or (2) above, wherein at least one of the support lead portions is an independent lead portion that is not electrically connected to the inner lead portion, or at least one of the support lead portions is a lead portion branched from the inner lead portion in the package body.

When the support lead portion is an independent lead portion that is not electrically connected to the inner lead portion, the inner lead portions for transmitting electric signals can be formed independently of the support lead portions, making it possible to decrease the stray capacity of the inner lead portions and to transmit signals at high speeds. Furthermore, the support lead portion that is branched from the inner lead portion can be provided at any position, offering an increased degree of freedom for designing the leads.

(4) The semiconductor device of the present invention is as described in (1) to (3) above, and the electrically nonconducting adhesive is at least partly formed on the ends on the main surface of the semiconductor chip.

According to this semiconductor device, an electrically nonconducting adhesive is formed on the ends on the main surface of the semiconductor chip making it possible to prevent short-circuiting between the semiconductor substrate and the leads at the ends of the semiconductor chip. That is, an insulating protection film, such as passivation film, is usually formed on the surface of the semiconductor chip. However, no insulating protection film is formed at the end portions so that the insulating protection film will not be damaged at the time of dividing the semiconductor chips in a scribing step. In the semiconductor device of the present invention, the support lead portions and the semiconductor chip are joined together with an insulating adhesive without having a base film. Therefore, the gap is very small. In this case, too, according to the present invention, an insulating adhesive is formed on the ends on the main surface of the semiconductor chip, eliminating the probability of short-circuiting between the semiconductor substrate and the support lead portions.

(5) The semiconductor device of the present invention is as described in (1) to (4) above, wherein an electrically nonconducting adhesive is formed in a region between the main surface of the semiconductor chip and the support lead portions at a plurality of places maintaining a predetermined distance.

In this semiconductor device, the electrically nonconducting adhesive is not uniformly formed on one surface on the region between the main surface of the semiconductor chip and the support lead portions, but is formed at a plurality of places maintaining a predetermined distance, making it possible to decrease the amount of the electrically nonconducting adhesive that is used and to shorten the time required by a step of applying the electrically nonconducting adhesive, thereby to rationalize the step. A decrease in the amount of application and rationalization of the application time are effective not only in decreasing the cost for producing the semiconductor device, but also in decreasing the amount of adsorption of moisture by the nonconducting adhesive, contributing to an improvement in the resistance against reflow and in the reliability of the semiconductor device.

(6) The semiconductor device of the present invention is as described in (1) to (5) above, in which the outer lead portions are folded so as to be capable of being mounted on the surfaces thereof and have extended portions that extend in a direction in parallel with the upper surface or the bottom surface of the package body, or have extended portions that are upwardly extending in a tilted direction of the package body.

Moreover, the semiconductor device of the present invention has pairs of stoppers formed on both side surfaces of the outer lead portions in the direction of their width, and extending toward the upper side of the package body. The outer lead portions have a width at the lower ends thereof which is narrower than the width of the extended portions that are upwardly extending in the tilted direction. Besides, the pairs of stoppers are formed by folding a dam that couples together the outer lead portions of the lead frame.

According to this semiconductor device, the outer lead portions are folded so as to be mounted on the surface. Besides, the semiconductor devices can be laminated to constitute a module, making it possible to realize an electronic circuit device of a small size mounting the semiconductor device of the present invention.

Furthermore, the outer lead portions are formed in a folded manner and have a portion extending in the horizontal direction or in the tilted direction. After all, the length of the outer lead portions can be extended. Therefore, the thermal stress due to a difference in the coefficient of thermal expansion after mounting by soldering can be absorbed by the whole outer lead portions inclusive of the extended portions. This lengthens the life of soldering after mounting, making it possible to enhance the reliability of the electronic circuit device mounting the semiconductor device of the present invention.

Moreover, the extended portions of the outer lead portions are upwardly extending in the tilted direction of the package body and, besides, pairs of stoppers are formed on both side surfaces of the outer lead portions in the direction of their width and extending toward the upper side of the package body. Furthermore, the width of the lower ends of the outer lead portions is narrower than the width of the extended portions upwardly extending in the tilted direction, making it easy to constitute the module by laminating the semiconductor devices. The pairs of stoppers are formed by folding a dam that couples together the outer lead portions of the lead frame and are, hence, formed easily.

(7) The semiconductor module of the present invention has a multi-chip modular structure in which the above-mentioned semiconductor devices are mounted in a plural number on a printed wiring board being laminated in the up-and-down direction.

According to such a semiconductor module, the semiconductor devices of a decreased thickness are laminated; i.e., the module as a whole is fabricated with a decreased thickness, making it possible to enhance the mounting density of the electronic circuit device mounting the semiconductor module.

(8) The IC card of the present invention has a printed wiring board, a frame and a back film. The mounting space between the printed wiring board and the back film has a distance of 0.56 mm or smaller, and the above-mentioned semiconductor device is mounted in the mounting space.

According to this IC card, the above-mentioned semiconductor device is mounted in the mounting space of the IC card. The semiconductor device is not one that is not molded, such as bare chip or the like, but is one molded with a package. Therefore, the IC card that is obtained features excellent resistance against fouling and alpha rays.

(9) The method of producing the semiconductor device of the present invention is the method for producing the semiconductor device described in (2) above, and in which the inner lead portions are held onto the main surface of the semiconductor chip by using a jig, the inner lead portions and bonding pads are connected together by bonding wires and, then, the jig is removed so that the inner lead portions connected to the wires are floated, or in which the semiconductor chip is pushed up by using a chip-supporting plate, so that the main surface of the semiconductor chip and the bottom surfaces of the inner lead portions are brought into contact or brought close to each other, the inner lead portions and the bonding pads are connected together by bonding wires and, then, the chip-supporting plate is removed, so that the bottom surfaces of the inner lead portions are separated away from the main surface of the semiconductor chip.

According to the above-mentioned method of producing the semiconductor devices, the inner lead portions are held onto the main surface of the semiconductor chip by using a jig, the wires are connected and, then, the jig is removed, so that the inner lead portions connected to the wires are floated, or the semiconductor chip is pushed up by using a chip-supporting plate, the wires are connected and, then, the chip-supporting plate is removed, so that the inner lead portions are separated away from the semiconductor chip. Therefore, the highest points of the wires are lowered making it possible to realize a semiconductor device having a decreased thickness.

BRIEF DESCRIPTION OF THE DRAWINGS

FIG. 2(a) is a sectional view along the line IIa—IIa of FIG. 1, and

FIG. 2(b) is a sectional view along the line IIb—IIb of FIG. 1;

FIG. 3(a) is a diagram illustrating the sizes of the semiconductor device of the embodiment 1, and FIG. 3(b) is a diagram illustrating another example of the semiconductor device of the embodiment 1;

FIG. 4 is a plan view illustrating a step of the method of producing the semiconductor device according to the embodiment 1 of the present invention;

FIG. 8 is a plan view illustrating a step of the method of producing the semiconductor device according to the embodiment 1 of the present invention;

FIG. 10 is a plan view illustrating a step of the method of producing the semiconductor device according to the embodiment 1 of the present invention;

FIG. 11 is a plan view illustrating a step of the method of producing the semiconductor device according to the embodiment 1 of the present invention;

FIG. 12 is a plan view illustrating a step of the method of producing the semiconductor device according to the embodiment 1 of the present invention;

FIG. 13 is a sectional view illustrating a state where the semiconductor device of the embodiment 1 of the present invention is mounted on a printed wiring board;

FIG. 14 is a sectional view illustrating a state where the semiconductor device of the embodiment 1 of the present invention is mounted on the printed wiring board;

FIG. 15 is a sectional view of the semiconductor device according to an embodiment 2 of the present invention;

FIG. 18 is a sectional view of the semiconductor device according to the embodiment 3 of the present invention;

FIG. 20 is a perspective view illustrating a memory module of the lamination type using the semiconductor devices of the embodiment 3 of the present invention;

FIG. 21 is a diagram illustrating a method of producing the memory module of the lamination type using the semiconductor devices of the embodiment 3 of the present invention;

FIGS. 27(a) and 27(b) are sectional views illustrating another method of producing the semiconductor device according to the embodiment 4 of the present invention;

DESCRIPTION OF THE PREFERRED EMBODIMENTS

Embodiments of the present invention will now be described in detail with reference to the drawings.

(Embodiment 1)

Figure 1:
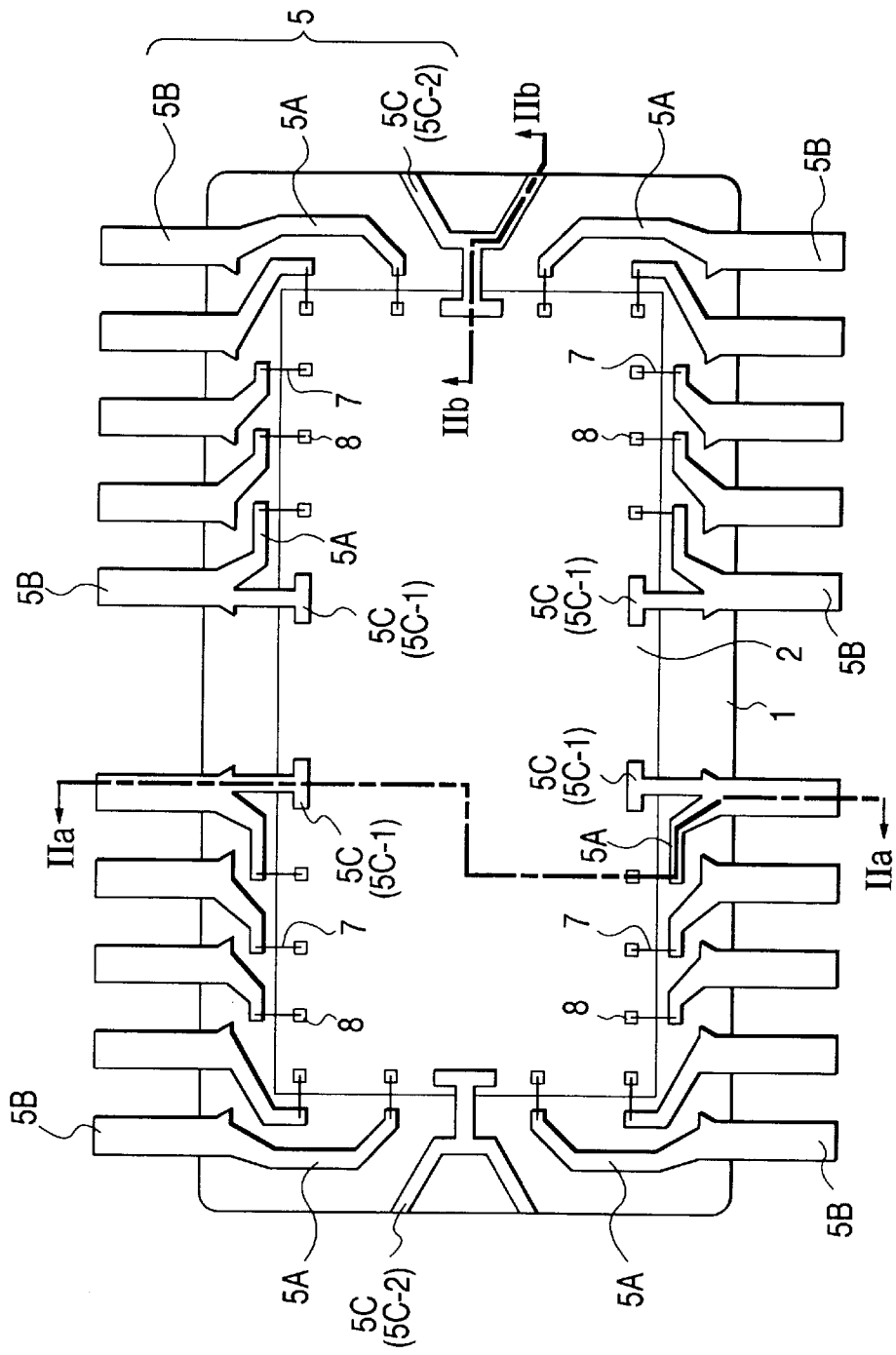
FIG. 1 is a plan view illustrating a semiconductor device according to an embodiment 1 of the present invention.

FIG. 1 is a plan view of a semiconductor device according to an embodiment 1, FIG. 2(a) is a sectional view along the line IIa—IIa in FIG. 1, and FIG. 2(b) is a sectional view along the line IIb—IIb in FIG. 1. FIG. 1 shows a package body in which features are partly omitted so that the internal structure of the package can be easily understood.

The semiconductor device of this embodiment is a TSOJ (Thin Small Outline J-lead package) which is a surface-mount-type LSI package.

A semiconductor chip 2 of a single crystalline silicon forming a memory LSI, such as DRAM (Dynamic Random Access Memory), is sealed inside a package body 1 obtained by molding an epoxy resin by the transfer-molding method. Inner lead portions 5A of a plurality of leads 5 constituting the external connection terminals of the TSOJ are arranged in surrounding relationship to the semiconductor chip 2, and are electrically connected to bonding pads 8 formed on the peripheral portion on the main surface of the semiconductor chip 2 via gold wires 7. Furthermore, support lead portions 5c of a plurality of leads 5 are arranged on the main surface of the semiconductor chip 2. The leads 5 are made of copper or an Fe-type alloy.

The support lead portions 5C include lead portions (5C-1) branched from the inner lead portions 5A and lead portions (5C-2) provided independently of the inner lead portions 5A. There is a freedom of design in that the support lead portions 5C-1 branched from the inner lead portions 5A can be arranged at any position to meet the arrangement of the inner lead portions 5A. The support lead portions 5C-2 provided independently of the inner lead portions 5A can be formed in a large size to favorably hold the semiconductor chip 2. On the other hand, provision of the support lead portions 5C-1 branched from the inner lead portions 5A permits a stray capacity of the support lead portions 5C-1 to be added to the inner lead portions 5A. Therefore, it is not desirable to provide the support lead portions 5C-1 for those terminals that transmit signals at high speeds. The support lead portions 5C-2 provided independently of the inner lead portions 5A have no such disadvantage. Though this embodiment 1 deals with the case where both the support lead portions 5C-1 and the support lead portions 5C-2 are provided, the device may be provided with the support lead portions 5C of either one type only. FIG. 2(a) is a sectional view that includes the support lead portions 5C-1, and FIG. 2(b) is a sectional view that includes the support lead portions 5C-2.

Referring to FIGS. 2(a) and 2(b), the support lead portions 5C of the leads 5 are adhered to the semiconductor chip 2 with an electrically nonconducting adhesive 6. That is, in this TSOJ, no thick insulating tape including a base film is provided between the support lead portions 5C and the semiconductor chip 2, i.e., they are adhered together with the adhesive 6 only. The adhesive 6 comprises, for example, a thermoplastic polyimide resin.

The outer lead portions 5B of the leads 5 are outwardly extending from both sides of the package body 1 in the lengthwise direction thereof. Referring to FIG. 2(a), the outer lead portion 5B includes a portion (5B-a) horizontally extending from nearly the central portion in the direction of the thickness (up-and-down direction) of the package body 1, an extended portion (5B-b) upwardly extending in a tilted direction, a portion (5B-c) extending in the vertical direction, and an end portion (5B-b) curved in a semicircular shape, and the other lead portion is formed in a so-called J-bend shape as a whole. Therefore, the outer lead portion 5B has an overall length longer than the outer lead portion of an ordinary TSOJ by the extended portion (5B-b) that extends upwardly in the tilted direction.

FIG. 3(a) shows the sizes of the portions of the TSOJ in the direction of the thickness. The thickness ($\Delta$Ta) of the resin from the lower surface of the package body 1 to the lower surface of the semiconductor chip 2 is 0.1 mm, the thickness ($\Delta$Tc) of the semiconductor chip 2 is 0.2 mm, and the thickness ($\Delta$Tb) of the resin from the upper surface of the semiconductor chip 2 to the upper surface of the package body 1 is 0.2 mm. Therefore, the package body 1 has a thickness of 0.5 mm. Furthermore, the thickness of the lead 5 is from 0.07 to 0.125 mm, the thickness of the adhesive 6 is 0.01 mm, and the space ($\Delta$s) between the lower surface of the package body 1 and the lower end of the outer lead portion 5B is 0.03 mm.

Thus, the thickness of the package body 1 is decreased so as to be small as 0.5 mm owing to the fact that the height of the support lead portion 5C is lower, by a difference $\Delta$d1, than the maximum height of the gold wire 7, and the upper surface of a portion where the gold wire 7 is connected to the inner lead portion 5A is lower, i.e., the upper surface of the inner lead portion 5A is lower, by a difference $\Delta$d2, than the main surface of the semiconductor chip 2. That is, the thickness ($\Delta$Tb) of the resin from the upper surface of the semiconductor chip 2 to the upper surface of the package body 1 is determined by a maximum height of the gold wire 7, and the maximum height of the gold wire 7 can be decreased by setting the height of the support lead portion 5C to be lower than the main surface of the semiconductor chip 2.

The gold wire 7 is stitch-bonded to the inner lead portion 5A. Upon selecting the bonding conditions, therefore, the height of the gold wire 7 can be lowered depending on the circumstances. Though the embodiment 1 has dealt with the case where the surface of the inner lead portion 5A was formed to be lower than the main surface of the semiconductor chip 2, the invention is in no way limited thereto. As shown in FIG. 3(b), the surface of the inner lead portion 5A may be higher than the main surface of the semiconductor chip 2.

To assemble the TSOJ of the embodiment 1, first, a lead frame LF shown in FIG. 4 is prepared. The practical lead frame LF has a continuous structure for accommodating five to six packages. FIG. 4, however, shows a region for one package only.

Figure 5:
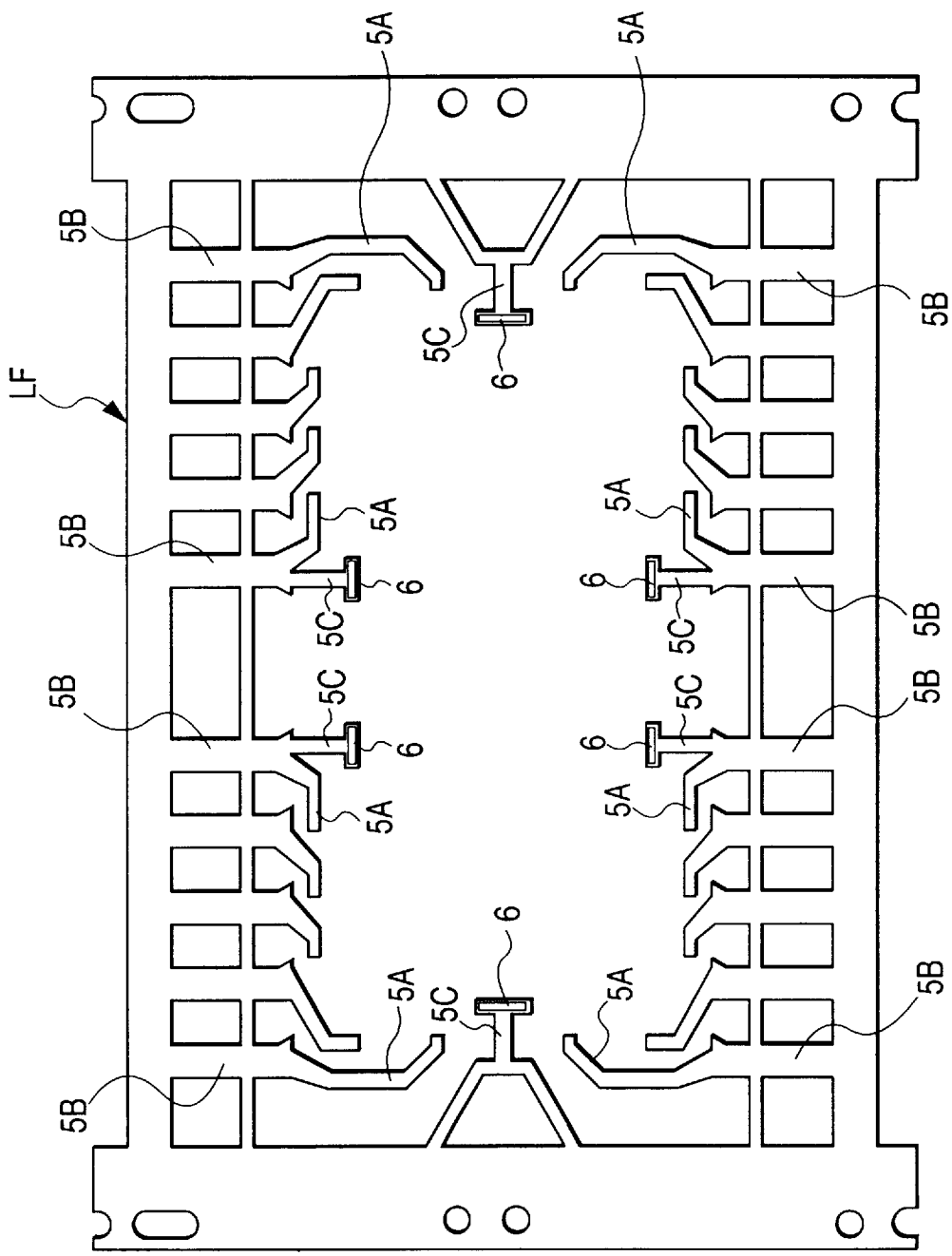
FIG. 5 is a plan view illustrating a step of the method of producing the semiconductor device according to the embodiment 1 of the present invention.
Figure 6:
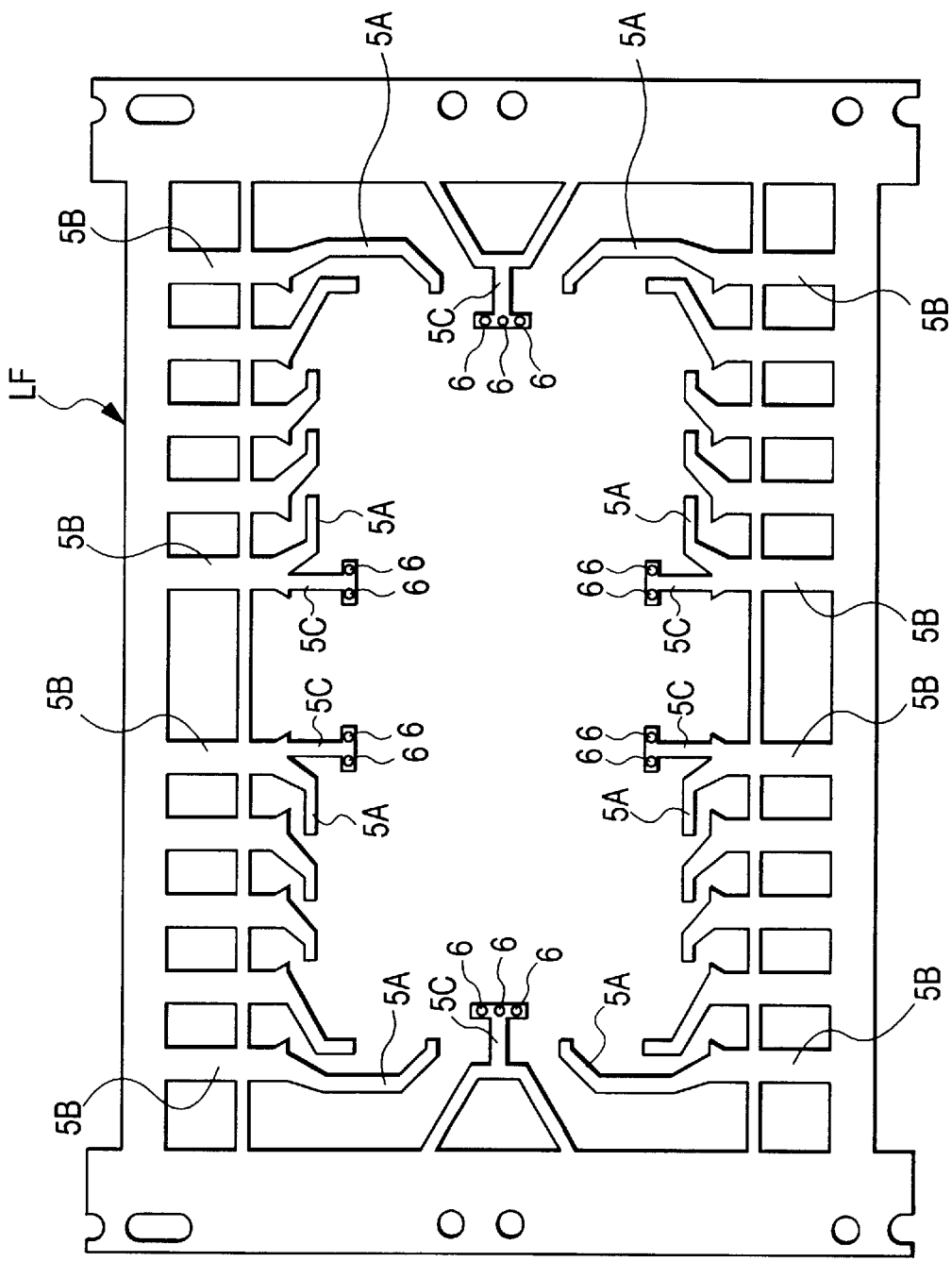
FIG. 6 is a plan view illustrating a step of the method of producing the semiconductor device according to the embodiment 1 of the present invention.

Next, the adhesive 6 is applied onto the back surfaces of the support lead portions 5C of the lead frame LF by using a dispenser or the like. As shown in FIG. 5, the adhesive 6 may be applied to the whole regions on the back surfaces of the support lead portions 5C where the semiconductor chip 2 is adhered. In this embodiment 1, however, the adhesive 6 is applied onto two or three spots on the support lead portions 5C as shown in FIG. 6 in order to decrease the amount of use of the adhesive agent 6 and the time for application. Instead of applying the adhesive 6 using a dispenser, furthermore, a sheet-like adhesive cut into small sizes may be placed on the support lead portions 5C.

Figure 7:
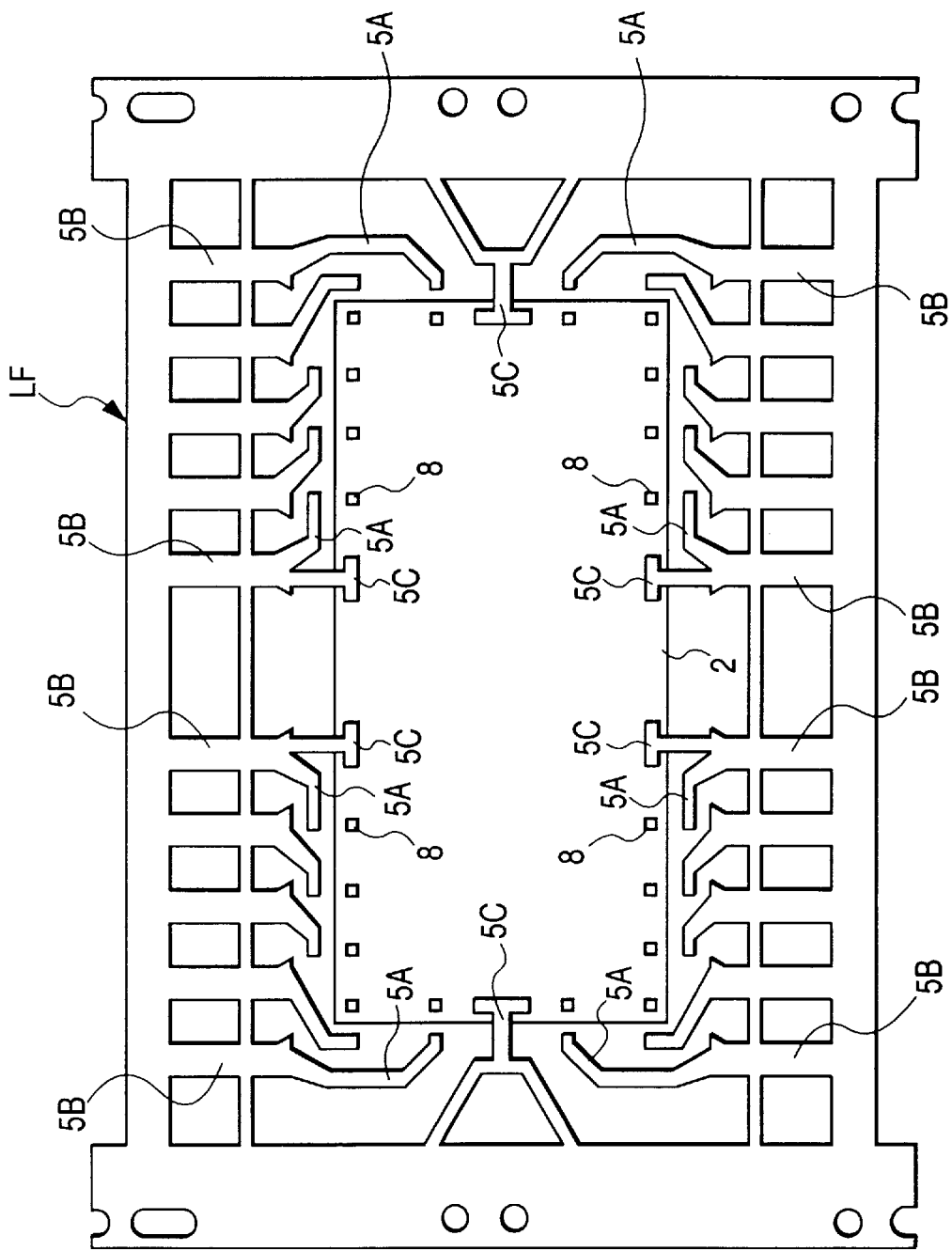
FIG. 7 is a plan view illustrating a step of the method of producing the semiconductor device according to the embodiment 1 of the present invention.
Figure 9:
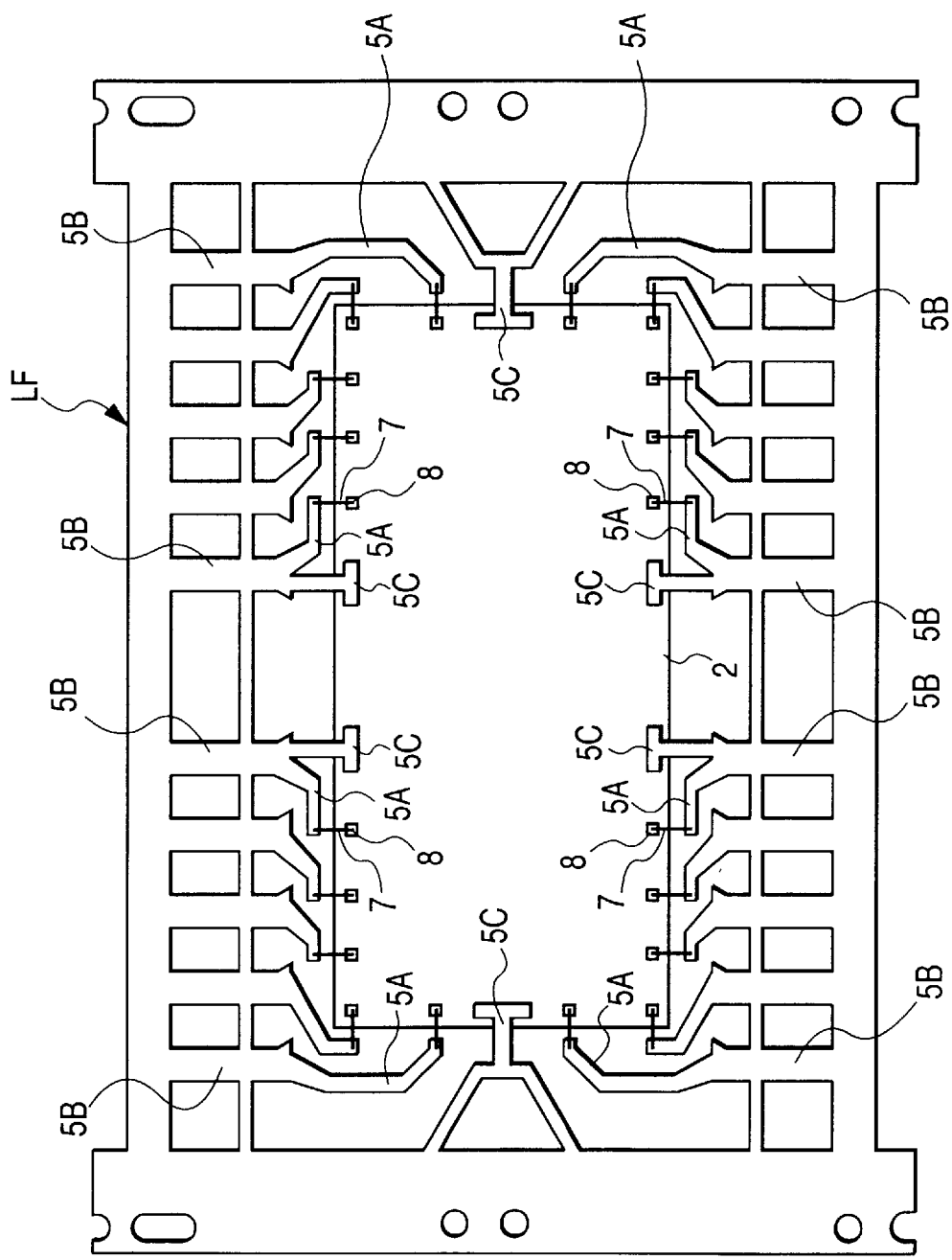
FIG. 9 is a plan view illustrating a step of the method of producing the semiconductor device according to the embodiment 1 of the present invention.

Next, referring to FIGS. 7 and 8, the support lead portions 5C are positioned on the main surface of the semiconductor chip 2 and are adhered thereto with the adhesive 6. Then, as shown in FIGS. 9 and 10, gold wires 7 are bonded between the bonding pads 8 of the semiconductor chip 2 and the inner lead portions 5A to electrically connect them together.

Next, referring to FIGS. 11 and 12, the package body 1 is molded by the transfer-molding method to seal the semiconductor chip 2. Thereafter, the portions other than the outer lead portions 5B of the lead frame LF exposed to the outside of the package body 1 are cut and removed and, then, the outer lead portions 5B are shaped to complete the TSOJ shown in FIGS. 1 and 2.

FIG. 13 is a sectional view illustrating a state where the TSOJ of the embodiment 1 is mounted on a printed wiring board 9. To mount the TSOJ on the printed wiring board 9, the outer lead portions 5B plated with a solder in advance are positioned on the electrodes 10 of the printed wiring board 9. A solder paste is printed in advance on the surface of the electrodes 10, and the outer lead portions 5B are temporarily secured onto the electrodes 10 utilizing an adhering force. Or, the outer lead portions 5B may be positioned on the electrodes 10, and may be pre-heated to slightly melt the solder plating on the surfaces of the outer lead portions 5B to temporarily secure them. When the TSOJ is to be mounted on the back surface (lower surface) of the printed wiring board 9, furthermore, a resin for temporary fastening is applied onto the back surface of the printed wiring board 9 and onto the back surface of the TSOJ, and the resin for temporary fastening is baked to position and secure the TSOJ. Thereafter, in this state, the solder plating is permitted to reflow. As shown in FIG. 14, the TSOJ according to this embodiment can be mounted without changing the shape of the outer lead portions 5B by turning the package body 1 upper surface down.

According to the TSOJ of the embodiment 1, the support lead portions 5C of the leads 5 and the semiconductor chip 2 are adhered together with an adhesive 6 only without interposing a base tape. Therefore, the thickness of the package body 1 can be decreased by an amount corresponding to the thickness of the base tape. Besides, the thickness of the package body 1 can be decreased by inhibiting the height of the support lead portions 5C not to exceed the maximum height of the gold wires 7 or by setting the surface of the inner lead portions 5A to be lower than the main surface of the semiconductor chip 2.

According to the TSOJ of this embodiment, the number of parts can be decreased compared with that of the TSOJ using an insulation tape, and the cost of production can be lowered.

According to the TSOJ of this embodiment, the base film having a relatively large hygroscopic property is not sealed inside the package body 1 unlike that of the TSOJ that uses the insulating tape. Therefore, reflow cracking develops less due to the heat at the time of mounting the TSOJ on the printed wiring board. When the adhesive 6 is applied like spots as shown in FIG. 6, furthermore, the amount of absorbing moisture due to the adhesive 6 decreases, and the resistance is further improved against the reflow cracking.

According to the TSOJ of this embodiment, the outer lead portion 5B is provided with an extended portion that upwardly extends in a tilted direction and, hence, has an increased overall length. Therefore, the outer lead portion 5B exhibits an increased resiliency. Stress due to a temperature cycle, such as soldering at the time of mounting on the substrate, is absorbed by the resiliency of the outer lead portions 5B, making it possible to prevent the occurrence of problems, such as solder cracks in the connection portions between the electrodes 10 of the printed wiring board 9 and the outer lead portions 5B.

(Embodiment 2)

Figure 16:
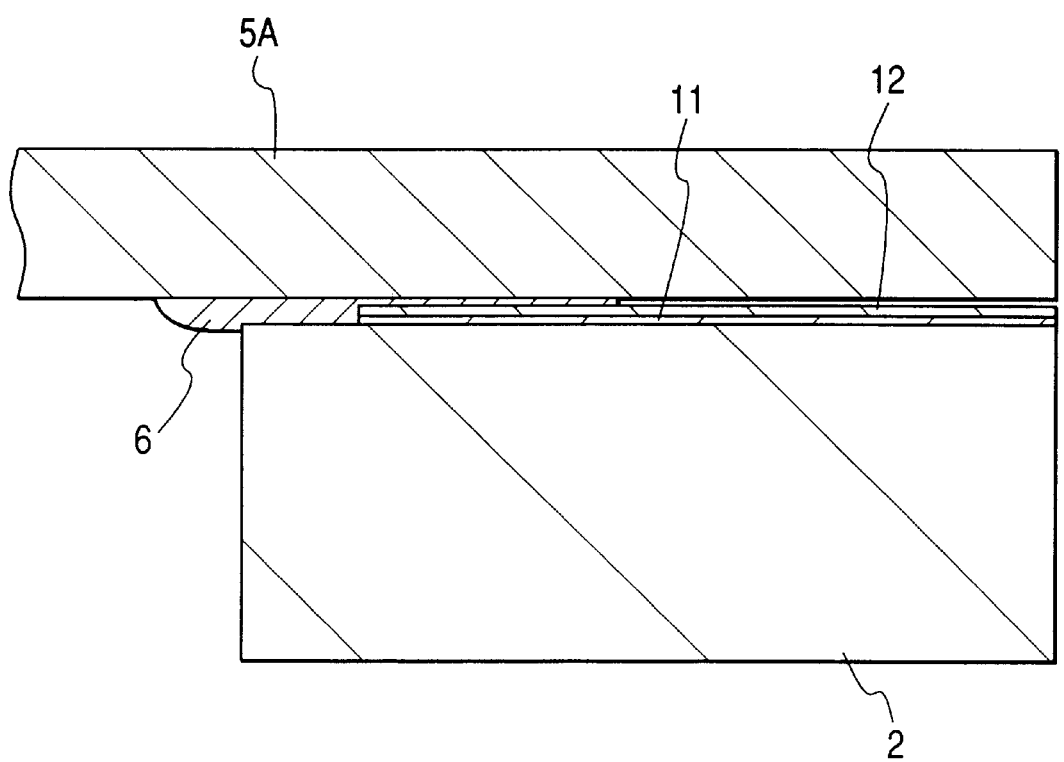
FIG. 16 is a sectional view illustrating, on an enlarged scale, major portions of the semiconductor device according to the embodiment 2 of the present invention.

FIG. 15 is a sectional view illustrating a semiconductor device according to an embodiment 2, and FIG. 16 is a sectional view illustrating a portion of FIG. 15 on an enlarged scale.

In the TSOJ of this embodiment, part of the adhesive 6 is disposed at end portions on the main surface of the semiconductor chip 2 to adhere the support lead portions 5C of the leads 5 to the semiconductor chip 2.

As shown on an enlarged scale in FIG. 16, the main surface of the semiconductor chip 2 is usually covered with a final passivation film 11 or a polyimide film 12 for protecting the integrated circuit. However, such a film is not formed at the ends on the main surface of the semiconductor chip 2, in order to prevent the formation of cracks in the final passivation film 11 composed of a silicon nitride or the like, or in the polymide film 12 for blocking alpha rays, that may occur at the time of forming the semiconductor chips 2 by dicing the wafer after the wafer process has been completed.

When the thickness of the adhesive agent 6 is decreased, therefore, the lower surface of the support lead portions 5C may come into contact with the end portions on the main surface of the semiconductor chip 2, resulting in the occurrence of a short-circuit. Moreover, the surface of the silicon substrate is exposed on the side surfaces of the semiconductor chip 2. Due to the deformation of the support lead portions 5C or the presence of electrically conducting foreign matter in the package, therefore, the support lead portions 5C may be short-circuited to the semiconductor chip 2.

According to this embodiment, therefore, the ends on the main surface of the semiconductor chip 2 are covered with an electrically nonconducting adhesive 6, in order to reliably prevent a short-circuiting between the support lead portions 5C and the semiconductor chip 2 even when the thickness of the adhesive agent 6 is decreased.

(Embodiment 3)

Figure 17:
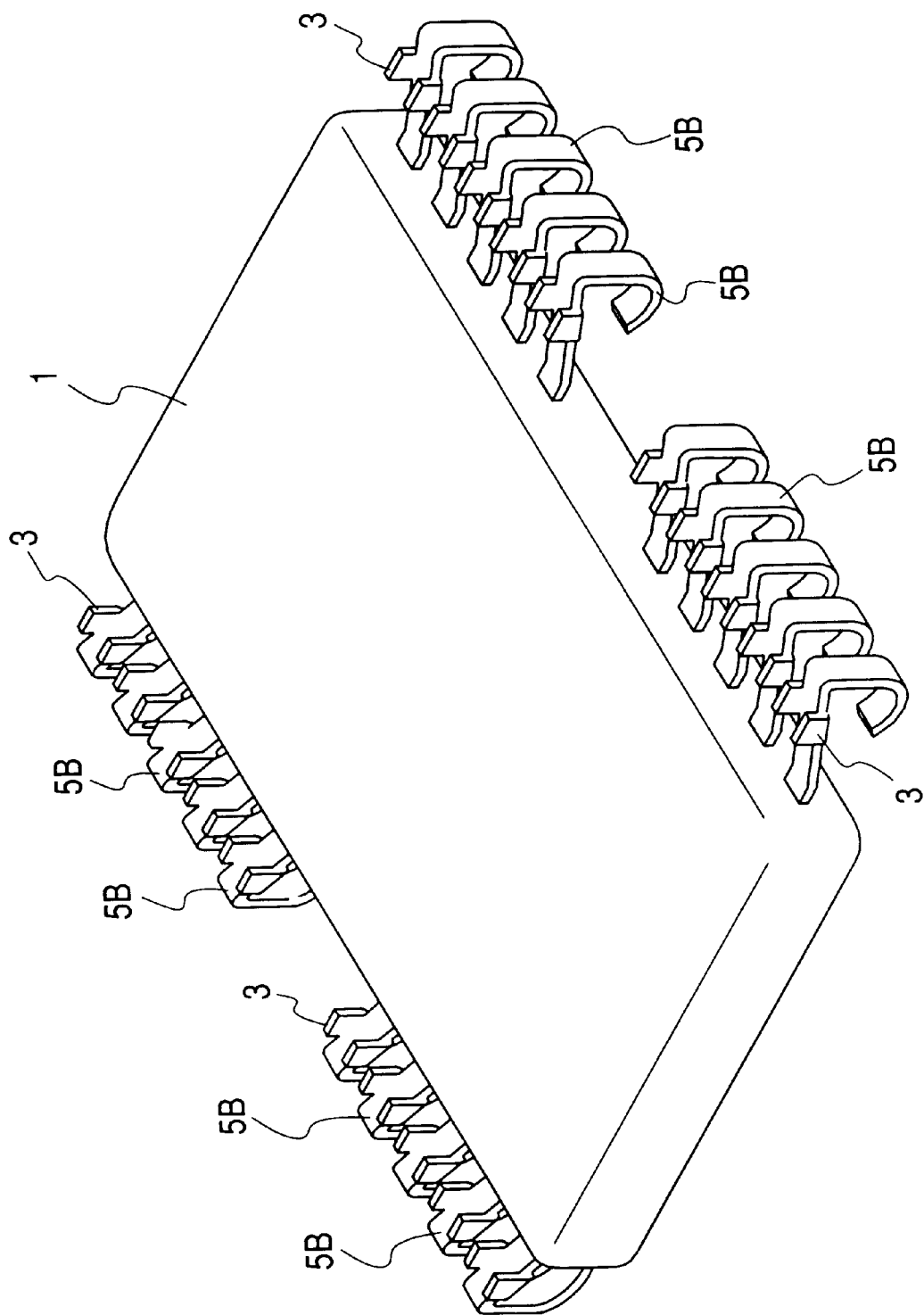
FIG. 17 is a perspective view illustrating the semiconductor device according to an embodiment 3 of the present invention.

FIG. 17 is a perspective view of the semiconductor device according to embodiment 3, and FIG. 18 is a sectional view of this semiconductor device.

Figure 19A:
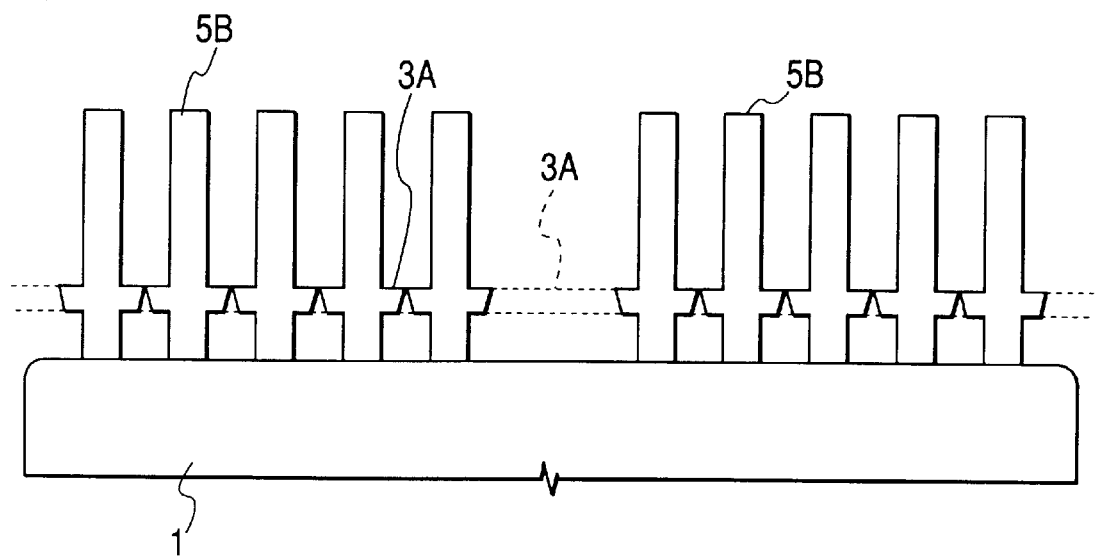
FIGS. 19(a) and 19(b) are plan views illustrating steps of the method of producing the semiconductor device according to the embodiment 3 of the present invention.
Figure 19B:
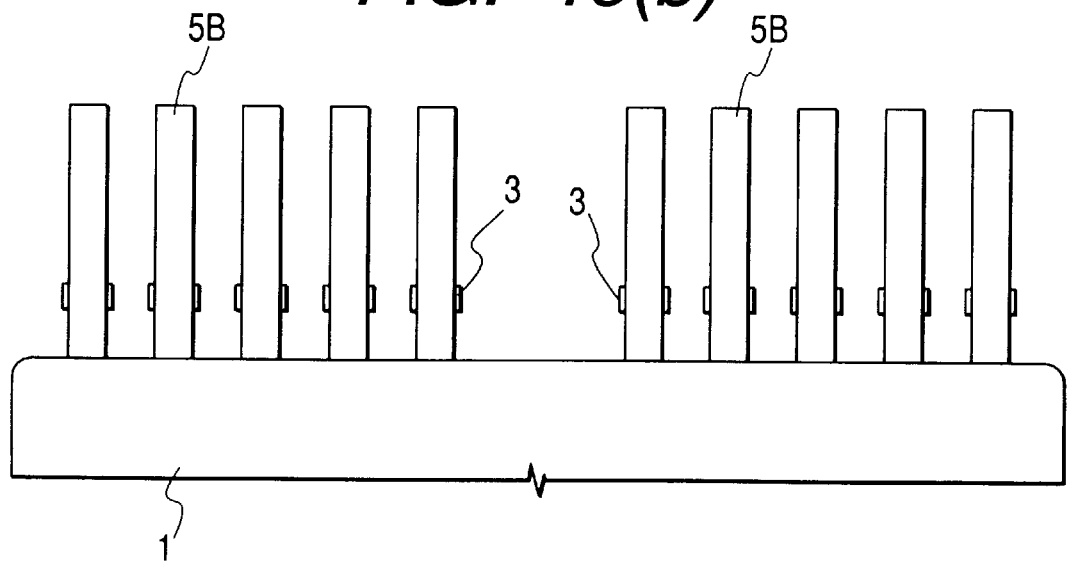

The TSOJ of this embodiment has pairs of stoppers 3, 3 formed on the extended portions upwardly extending in a tilted direction from the outer lead portions 5B of the leads 5, the pairs of stoppers 3, 3 upwardly extending from both side surfaces in the direction of the width of the outer lead portions 5B. The stoppers 3 may be constituted by using a material different from that of the leads 5. In this embodiment, however, the stoppers 3 are made of the same material as the leads 5. Concretely, as shown in FIG. 19(*a*), the dam 3A coupling the outer lead portions 5B together is cut as shown in a step of cutting the lead frame after the package body 1 has been molded. Then, as shown in FIG. 19(*b*), the dam 3A is upwardly folded to form the stoppers 3.

FIG. 20 is a perspective view of a lamination-type memory module obtained by laminating the TSOJs of this embodiment in, for example, two stages on the printed wiring board 9 in two rows.

To fabricate the lamination-type memory module as shown in FIG. 21, a first TSOJ is mounted on the electrodes 10 of the printed wiring board 9, and a second TSOJ is placed thereon, the lower ends of the outer lead portions 5B of the second TSOJ being positioned on the outer lead portions 5B of the first TSOJ according to the process explained in the embodiment 1 above. In this case, a solder paste may be applied onto the lower ends of the outer lead portions 5B of the second TSOJ in advance, so that the upper and lower outer lead portions 5B are temporarily fastened together utilizing an adhesive force.

Figure 22:
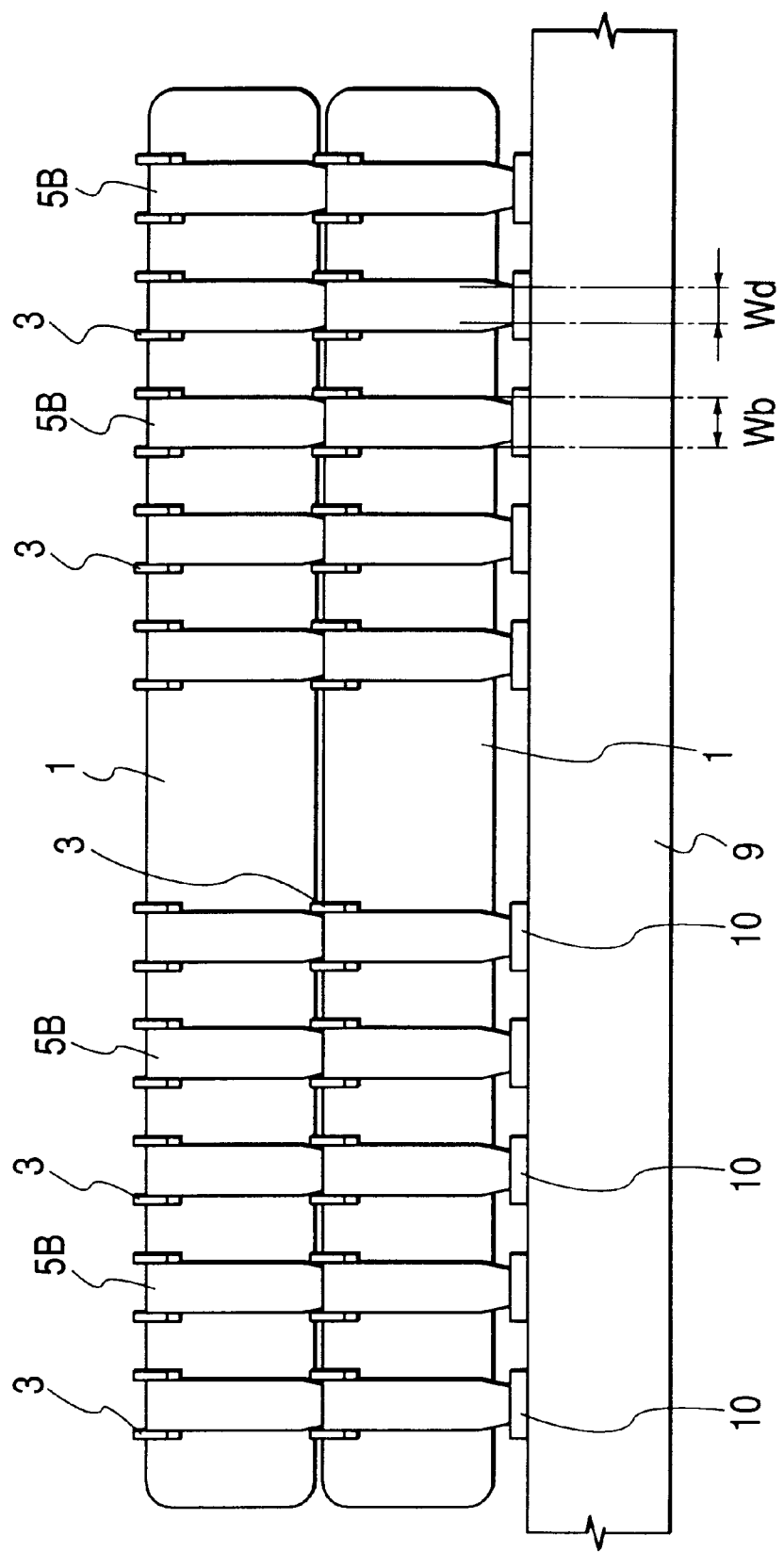
FIG. 22 is a diagram illustrating the method of producing the memory module of the lamination type using the semiconductor devices of the embodiment 3 of the present invention.

The TSOJ of the embodiment 3 has the above-mentioned pairs of stoppers 3, 3 provided at both end surfaces of the outer lead portions 5B in the direction of width thereof. By utilizing the stoppers 3, 3 as guides, therefore, the lower ends of the outer lead portions 5B of the second TSOJ can be correctly and quickly positioned on the outer lead portions 5B of the first TSOJ. In this case, as shown in FIG. 22, the width (Wd) of the lower ends of the outer lead portions 5B, i.e., the width (Wd) of the semicircularly curved portions, is set to be narrower than the width (Wb) of the portions that upwardly extend in the tilted direction (Wd<Wb), so that the lower ends of the outer lead portions 5B can be quickly inserted among the stoppers 3, 3 even in case the outer lead portions 5B have been deformed to some extent.

Thereafter, the printed wiring board 9 is placed on a tray and is conveyed into a reflow furnace where the solder plated on the surfaces of the outer lead portions 5B of the TSOJ is melted to connect and fasten the electrodes 10 of the printed wiring board 9 and the outer lead portions 5B of the first TSOJ together, and to connect and fasten the outer lead portions 5B of the upper and lower TSOJs together.

The outer lead portions 5B of the second TSOJ are inserted among the stoppers 3, 3 provided on the outer lead portions 5B of the first TSOJ. Therefore, the outer lead portions 5B are not deviated in the direction of the width thereof (direction of long side of the package body 1) despite any vibration on the passage along which the tray carrying the printed wiring board 9 is conveyed into the reflow furnace. Moreover, the lower ends of the outer lead portions 5B of the second TSOJ are positioned on the portions upwardly extending in the tilted direction of the outer lead portions 5B of the first TSOJ, and are prevented from being deviated in the direction in which the outer lead portions 5B extend (direction of short side of the package body 1). The stoppers 3 need not be provided on all of the outer lead portions 5B outwardly extending from the package body 1, but may be provided on some of the outer lead portions 5B only.

According to the embodiment 3 as described above, the outer lead portions 5B of the upper and lower TSOJs are highly accurately and quickly connected together at the time of assembling the memory module by laminating a plurality of TSOJs on the printed wiring board 9. It is therefore possible to improve the production yield and throughput of the memory module.

According to the third embodiment, the thickness of the lamination-type memory module is decreased by using thin TSOJs.

Figure 23:
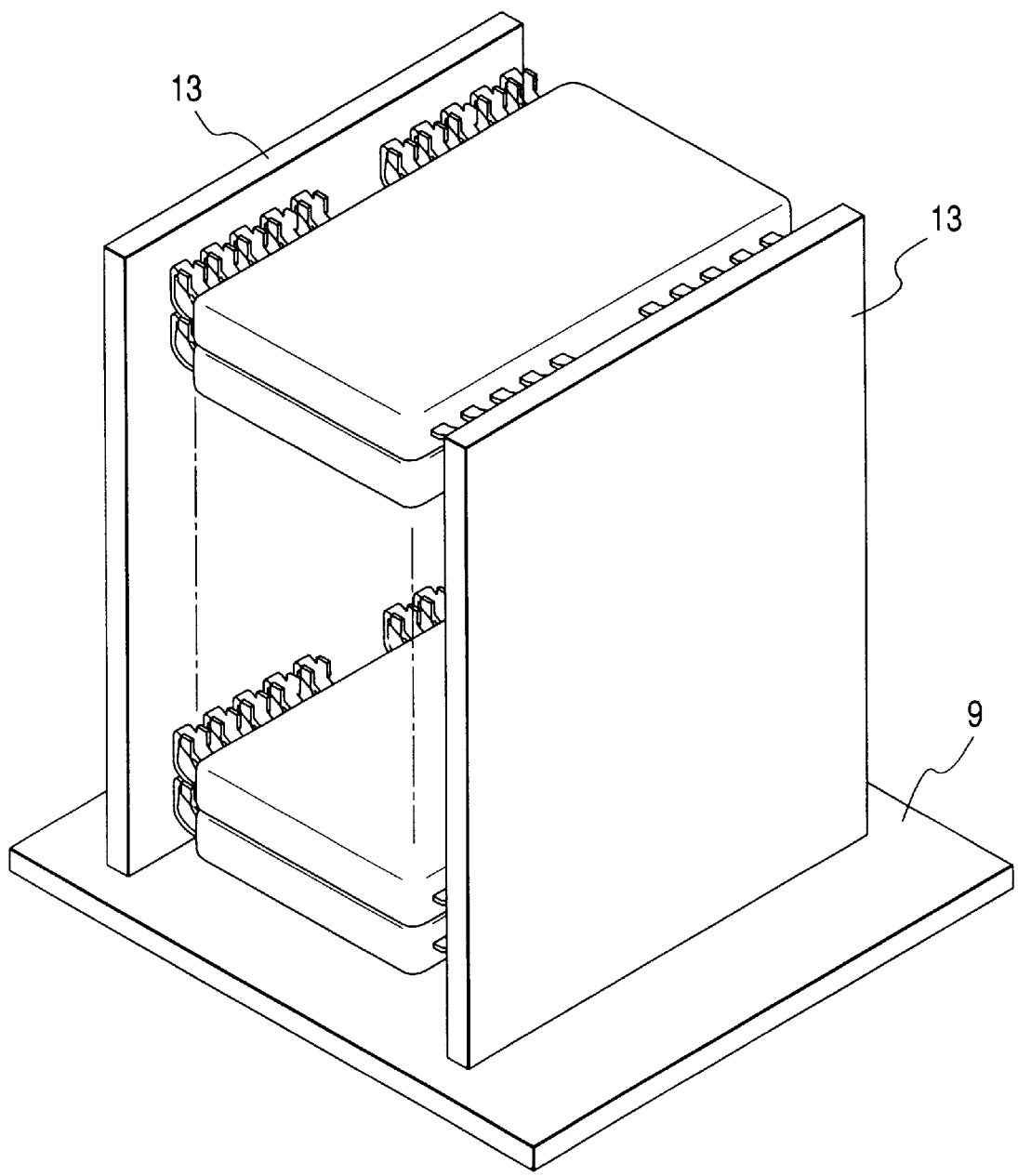
FIG. 23 is a perspective view illustrating another memory module of the lamination type using the semiconductor devices of the embodiment 3 of the present invention.

The TSOJs of the embodiment 3 can be mounted after being laminated in three or more layers as a matter of course. FIG. 23 illustrates, for example, a lamination-type memory module in which the TSOJs are electrically connected together by a pair of printed wiring boards 13 arranged on both side surfaces thereof.

(Embodiment 4)

Figure 24:
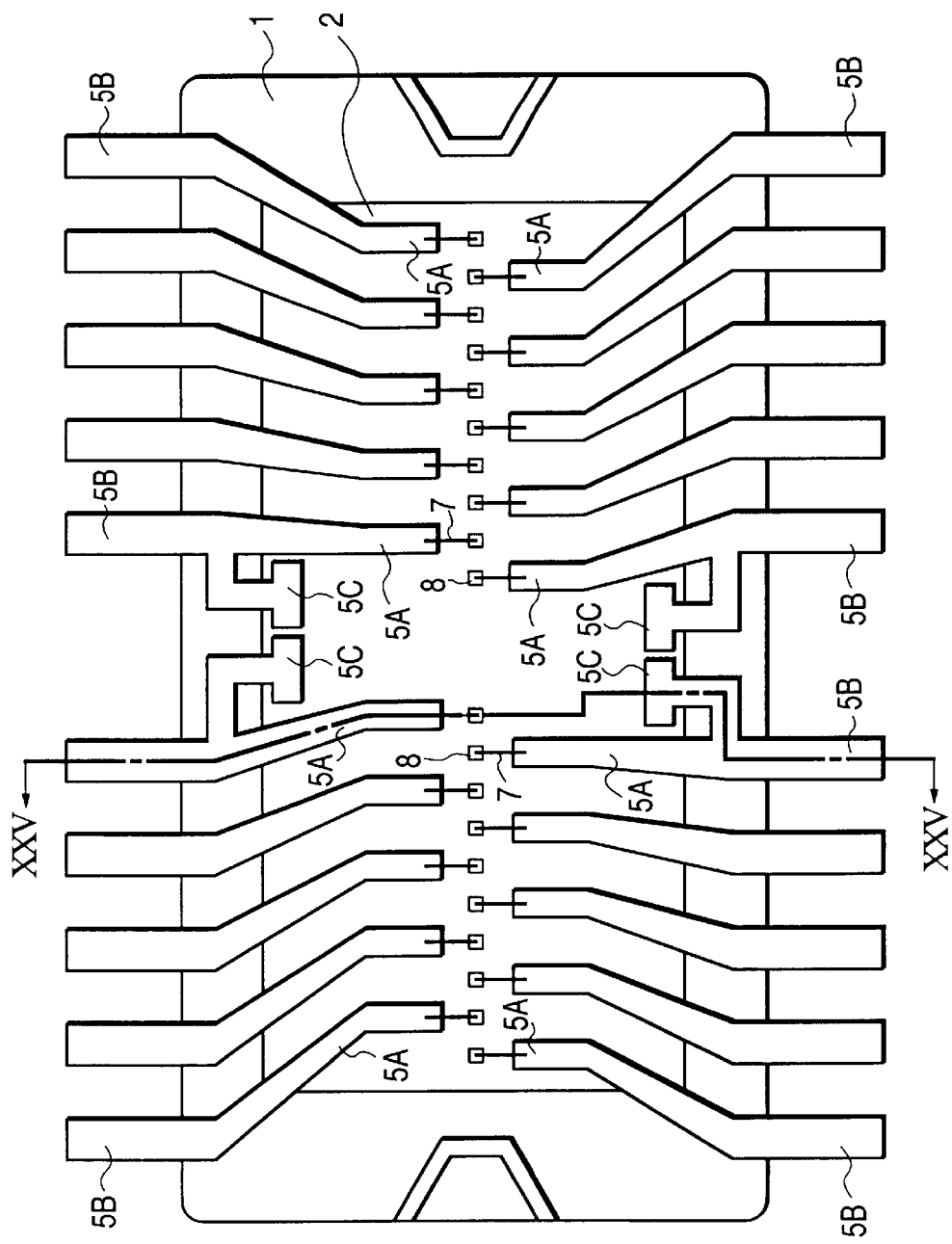
FIG. 24 is a plan view illustrating the semiconductor device according to an embodiment 4 of the present invention.
Figure 25:
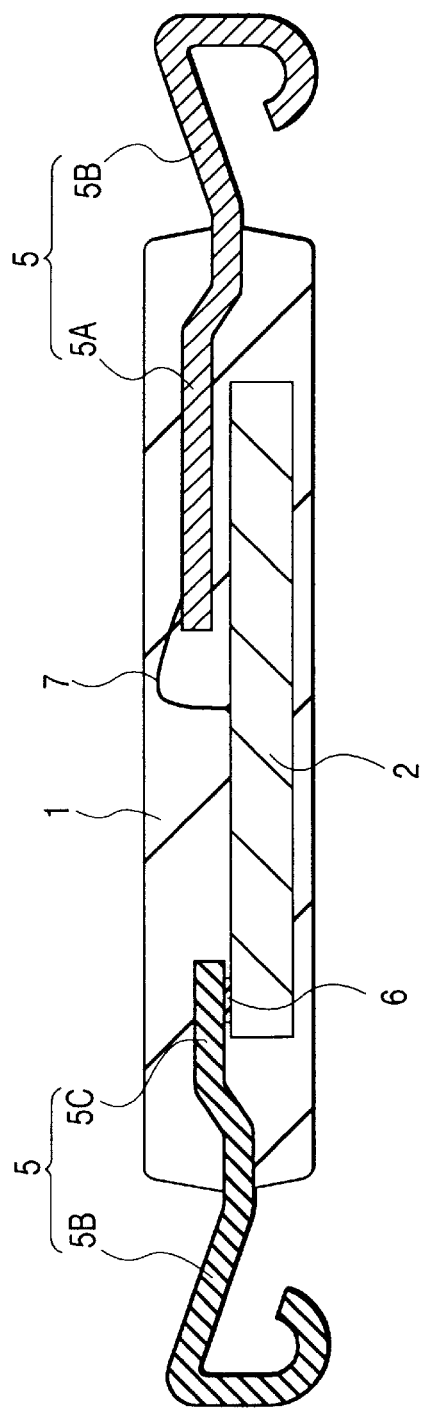
FIG. 25 is a sectional view illustrating the semiconductor device according to the embodiment 4 of the present invention.

FIG. 24 is a plan view of the semiconductor device according to an embodiment 4, and FIG. 25 is a sectional view of the semiconductor device.

In the TSOJ of the embodiment 4, the inner lead portions 5A of the leads 5 are disposed on the main surface of the semiconductor chip 2, and are electrically connected to the bonding pads 8 arranged at the central portion of the semiconductor chip 2 via gold wires 7. Furthermore, the support lead portions 5C of the leads 5 are adhered onto the semiconductor chip 2 using an electrically nonconducting adhesive 6.

Unlike the TSOJs of the embodiments 1 to 3, the TSOJ of the embodiment 4 has the inner lead portions 5A arranged on the main surface of the semiconductor chip 2, which is slightly disadvantageous from the standpoint of decreasing the thickness of the package body 1. However, the embodiment 4 covers even one in which the bonding pads 8 are disposed at the central portion of the semiconductor chip 2. A space of about 0.1 mm may be provided between the main surface of the semiconductor chip 2 and the bottom surfaces of the inner lead portions 5A.

Figure 26:
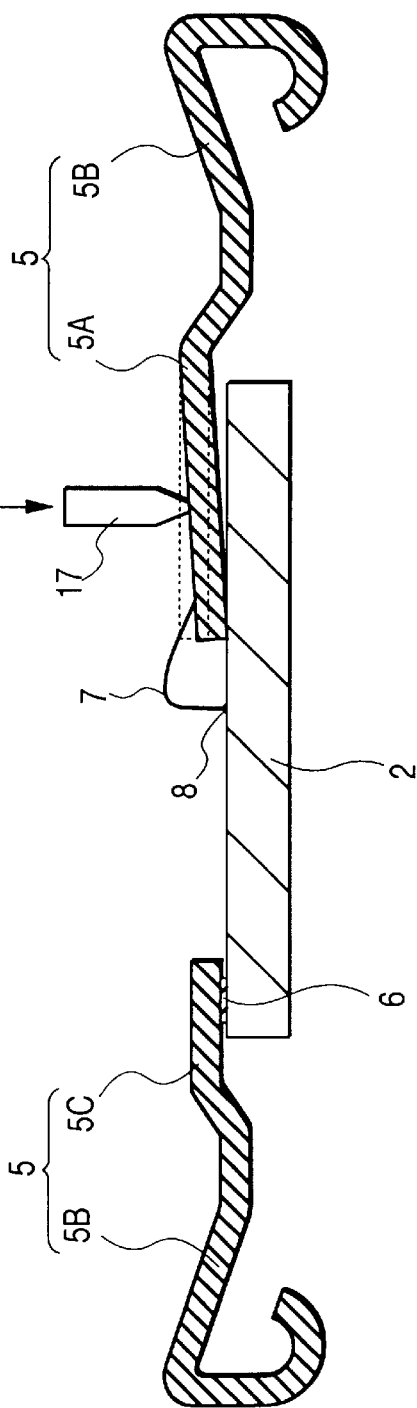
FIG. 26 is a sectional view illustrating a step of the method of producing the semiconductor device according to the embodiment 4 of the present invention.

The method of producing the TSOJ of the embodiment 4 is the same, up to the step of adhering the semiconductor chip 2 onto the lead frame LF of the embodiment 1 (FIGS. 7 and 8). In the embodiment 4, however, the inner lead portions 5A are pushed by a jig 17a at the time of bonding the gold wires 7 as shown in FIG. 26; i.e., the gold wires 7 are bonded in this pushed state. When the wires are bonded in this way, the inner lead portions 5A are pushed and the ends thereof are lowered as shown, making it possible to shorten the gold wires 7. After the gold wires 7 are bonded, the jig 17a is removed, whereby the ends return back to the initial height due to the spring back of the inner lead portions 5A and are disposed at positions separated away from the main surface of the semiconductor chip 2.

According to this method, the gold wires 7 are bonded in a short distance, making it possible to lower the height of the gold wires 7 after the spring back. As a result, it is made possible to decrease the thickness of the package body 1.

Moreover, the following method can be exemplified for producing the TSOJ of the embodiment 4. That is, referring to FIG. 27(*a*), the semiconductor chip 2 is pushed up together with the support lead portions 5C by a chip-supporting plate 17b and, in this state, the gold wires 7 are bonded. In this case, the support lead portions 5C and the outer lead portions 5B are partly deformed. When the wires are thus bonded, the lower surfaces of the inner lead portions 5A and the main surface of the semiconductor chip 2 come into contact or are brought close to each other in parallel relationship with each other, and the surface of the semiconductor chip 2 is not scarred. Furthermore, the lengths of the gold wires 7 are shortened in the same manner as described above. After the gold wires 7 are bonded, the chip-supporting plate 17b is lowered, whereby the support lead portions 5C and the outer lead portions 5B resume the initial shapes as shown in FIG. 27(*b*), and the inner lead portions 5A are disposed at positions separated away from the main surface of the semiconductor chip 2.

According to the above-mentioned method, the gold wires 7 are bonded in a short distance, making it possible to lower the height of the gold wires 7 and to prevent the surface of the semiconductor chip 2 from being damaged.

In these cases, too, the ends of the main surface of the semiconductor chip 2 are covered with an adhesive as in the above-mentioned embodiment 2, in order to reliably prevent a short-circuit between the support lead portions 5C and the semiconductor chip 2, despite the fact that the thickness of the film of the adhesive 6 is decreased. As in the above-mentioned embodiment 3, furthermore, the stoppers 3, 3 may be provided on the extended portions of the outer lead portions 5B to improve the production yield and throughput of the lamination-type memory module.

(Embodiment 5)

Figure 28:
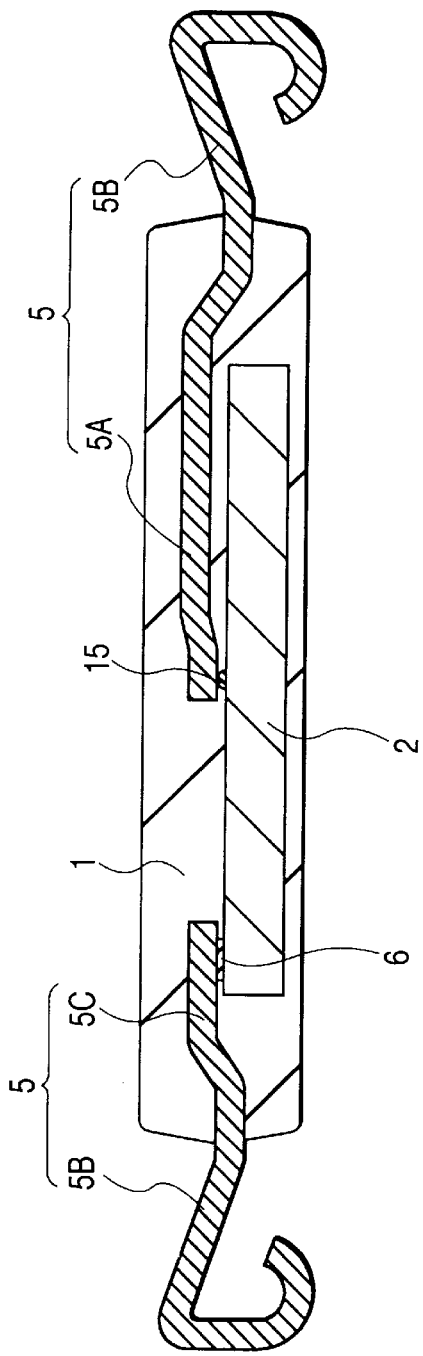
FIG. 28 is a sectional view illustrating the semiconductor device according to an embodiment 5 of the present invention.

FIG. 28 is a sectional view of the semiconductor device of the embodiment 5.

In the TSOJ of this embodiment, the inner lead portions 5A of the leads 5 are electrically connected onto the gold bump electrodes 15 formed on the main surface of the semiconductor chip 2. Furthermore, the support lead portions 5C of the leads 5 are adhered to the semiconductor chip 2 with the electrically nonconducting adhesive 6.

In the TSOJ of this embodiment, use is made of the bump electrodes 15 in place of the gold wires 7. Therefore, the thickness of the resin from the upper surface of the semiconductor chip 2 to the upper surface of the package body 1 is decreased compared with that of the TSOJ of the above-mentioned embodiment 4, making it possible to further decrease the thickness of the package body 1.

In this case, too, the ends of the main surface of the semiconductor chip 2 are covered with the adhesive 6 as in the above-mentioned embodiment 2. It is therefore made possible to reliably prevent the occurrence of a short-circuit between the support lead portions 5C and the semiconductor chip 2 even when the thickness of the film of the adhesive 6 is decreased. As in the above-mentioned embodiment 3, furthermore, the stoppers 3, 3 may be provided on the extended portions of the outer lead portions 5B to improve the production yield and throughput of the lamination-type memory module.

(Example 6)

Figure 29:
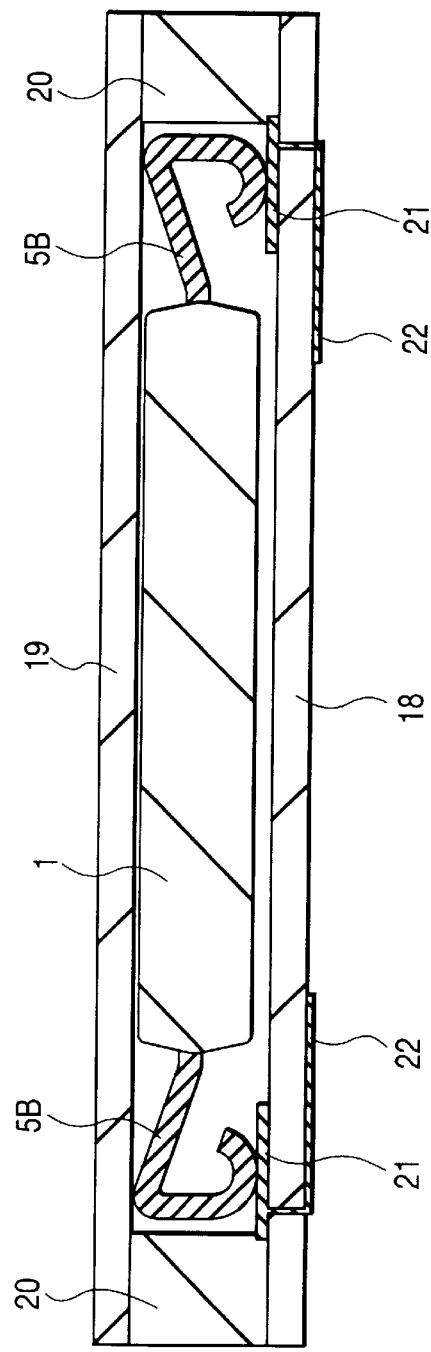
FIG. 29 is a sectional view illustrating the semiconductor device according to the embodiment 5 of the present invention.

FIG. 29 is a sectional view of an IC card of an embodiment 6.

In the IC card of the embodiment 6, the TSOJ of any one of the above-mentioned embodiments 1 to 5 is mounted in a mounting space between a printed wiring board 18, having a thickness of 0.1 mm, and a back film 19 having a thickness of 0.1 mm. The printed wiring board 18 and the back film 19 are supported by a frame 20 made of a PVC. The printed wiring board 18 is provided with electrodes to which the outer lead portions 5B will be connected, the electrodes 21 being connected to contact electrodes 22 on the back surface of the printed wiring board 18.

The IC card has a mounting space which is a maximum of 0.56 mm. So far, therefore, it was necessary to employ a means for mounting a bare chip and bonding the wires, or a means for effecting the mounting using a tape carrier. According to this embodiment, however, the TSOJ has a thickness of 0.5 mm and can be mounted in a mounting space which is as small as 0.56 mm. This makes it very easy to handle the semiconductor device at the time of mounting, to simplify the steps for fabricating the IC card, and, besides, to use a semiconductor device molded with a resin, offering improved reliability against the fouling and alpha rays and enhanced reliability of the IC card.

In the foregoing the invention accomplished by the present inventors was described with reference to various embodiments. It should, however, by noted that the invention is in no way limited to the above-mentioned embodiments only but can be modified in a variety of ways without departing from the scope thereof.

Figure 30:
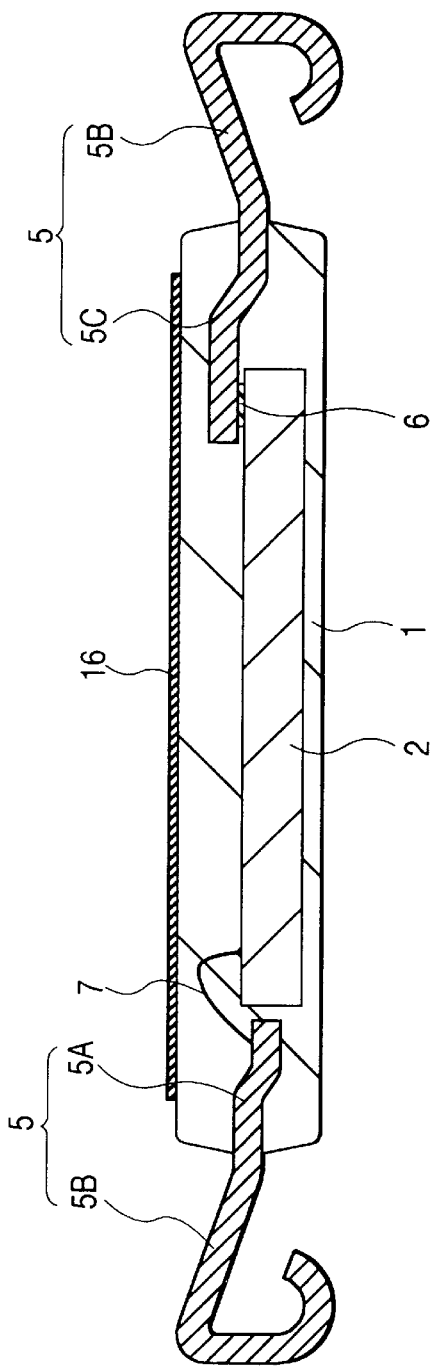
FIG. 30 is a sectional view illustrating the semiconductor device according to a further embodiment of the present invention.
Figure 31:
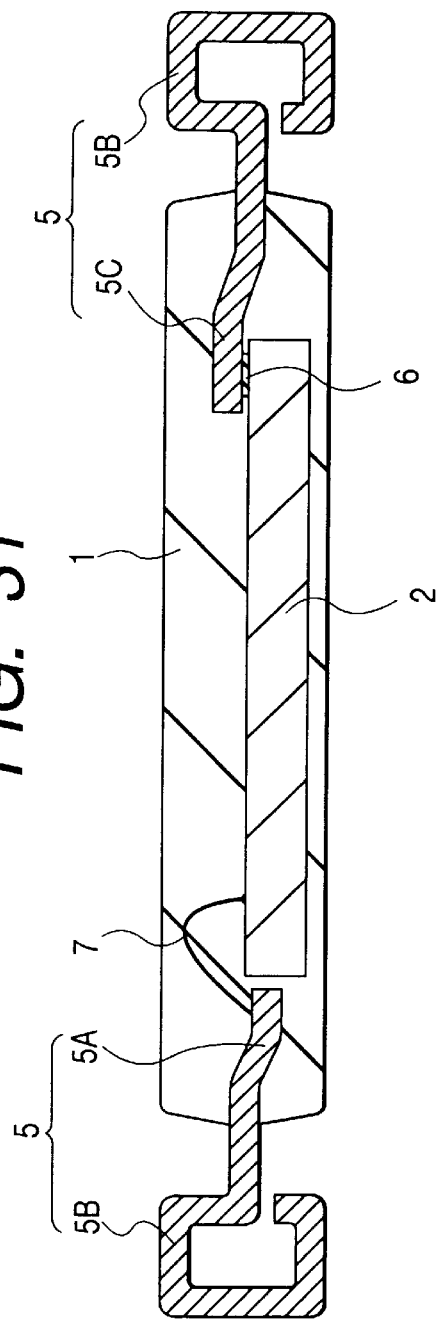
FIG. 31 is a sectional view illustrating the semiconductor device according to a further embodiment of the present invention.

As shown in, for example, FIG. 30, a light reflection layer, such as of an aluminum foil 16, is formed on the surface of the package body 1, so that the characteristics, such as data retention, etc., will not be deteriorated by light even when the package body 1 is constituted in a very small thickness. Moreover, the outer lead portions 5B of the leads 5 are not limited to those of the shapes described in the embodiments 1 to 5, but may take various shapes, such as the one shown in FIG. 31. In the case of FIG. 31, stoppers 3 may be provided as a matter of course.

The present invention is not limited to a package of the TSOJ type only, but can be widely adapted to the packages of the LOC structure. The invention can be further adapted to packages of the chip-on-lead structure in which the semiconductor chip is disposed on the inner lead portions of the leads. Moreover, the invention can be adapted not only to packages in which a memory LSI is sealed, but also to the packages in which a microcomputer or a logic LSI is sealed and to a lamination-type multi-chip module using the above-mentioned package.

What is claimed is:

1. A semiconductor device comprising:
   a semiconductor chip having bonding pads formed on the main surface thereof;
   a plurality of leads, each having an inner lead portion and an outer lead portion;
   a chip-supporting lead;
   bonding wires for connecting the ends of said inner leads to said bonding pads; and
   a resin sealing member for sealing said semiconductor chip, said inner lead portions, said bonding wires and said chip-supporting lead; wherein
   the ends of said inner portions are arranged along the outer periphery of said semiconductor chip and are positioned within the thickness of said semiconductor chip in the direction of thickness of said semiconductor chip;
   said outer lead portions outwardly extend from the side surfaces of said resin sealing member; and
   a portion of said chip-supporting lead is arranged on the main surface of said semiconductor chip and is adhered to the main surface of said semiconductor chip via an adhesive,
   wherein the thickness of said chip-supporting lead portion in the direction of thickness of said semiconductor chip does not exceed a peak height of loops of said bonding wires.

2. A semiconductor device according to claim 1, wherein said chip supporting lead is not electrically connected to said bonding wires.

3. A semiconductor device according to claim 1, wherein said chip supporting lead is branched from said inner leads in said resin sealing member.

4. A semiconductor device according to claim 1, wherein said adhesive is at least partly formed on the ends of the main surface of said semiconductor chip.

5. A semiconductor device according to claim 1, wherein said adhesive exists in a plurality of regions maintaining a predetermined distance between the main surface of said semiconductor chip supporting and said chip lead.

6. A semiconductor device according to claim 1, wherein said outer lead portions are folded so as to be capable of mounting on their surfaces, and include, in portions thereof, extended portions extending in a direction in parallel with the upper surface or the bottom surface of said resin sealing member.

7. A semiconductor device according to claim 1, wherein said outer lead portions are folded so as to be capable of mounting on their surfaces, and include, in portions thereof, extended portions upwardly extending in a tilted direction of said resin sealing member.

8. A semiconductor device according to claim 6, wherein said outer lead portions are provided with pairs of stoppers on both side surfaces in the direction of the width thereof, said pairs of stoppers extending toward the upper side of said resin sealing member.

9. A semiconductor device according to claim 8, wherein the width of the lower ends of the outer lead portions is narrower than the width of the extended portions upwardly extending in said tilted direction.

10. A semiconductor device according to claim 8, wherein said pairs of stoppers are formed by folding a dam that couples together the outer leads of the lead frame.

11. A semiconductor device comprising:
a mounting substrate on which are formed a plurality of wirings;
a first surface-mount-type package disposed on said mounting substrate; and
a second surface-mount-type package laminated on said first surface-mount-type package; wherein
each of said first and second surface-mount-type packages comprises:
a semiconductor chip having bonding pads formed on the main surface thereof;
a plurality of leads, each having an inner lead portion and an outer lead portion;
a chip-supporting lead;
bonding wires for connecting the ends of said inner lead portions to said bonding pads; and
a resin sealing member for sealing said semiconductor chip, said inner lead portions, said bonding wires and said chip-supporting lead; wherein
the ends of said inner lead portions are arranged along the outer periphery of said semiconductor chip and are positioned within the thickness of said semiconductor chip in the direction of thickness of said semiconductor chip;
said outer lead portions outwardly extend from the side surfaces of said resin sealing member;
a portion of said chip-supporting lead is arranged on the main surface of said semiconductor chip and is adhered to the main surface of said semiconductor chip via an adhesive; and
the corresponding outer lead portions of said first and second surface mount type packages are electrically connected together,
wherein the thickness of said chip-supporting lead portion in the direction of thickness of said semiconductor chip does not exceed a peak height of loops of said bonding wires.

12. A semiconductor device comprising:
a semiconductor chip having a main surface, a rear surface opposite to said main surface, and a side surface extending from said main surface to said rear surface, said semiconductor chip having semiconductor elements and bonding pads formed on said main surface;
a plurality of leads, each having an inner lead portion and an outer lead portion which is continuous with said inner lead portion, ends of said inner lead portions being arranged at the vicinity of said side surface of said semiconductor chip;
a chip supporting lead having a first portion and a second portion which is continuous with said first portion, said first portion of said chip supporting lead being disposed on said main surface, said second portion of said chip supporting lead being outside of said semiconductor chip;
bonding wires electrically connecting said ends of said inner lead portions of said plurality of leads with said bonding pads, respectively; and
a resin sealing member sealing said semiconductor chip, said inner lead portions, said bonding wires and said chip supporting lead, said outer lead portions of said plurality of leads extending outwardly from said resin sealing member,
wherein said ends of said inner lead portions are disposed between said main surface and said rear surface of said semiconductor chip in a thickness direction of said semiconductor chip such that an upper surface of each of said inner lead portions is positioned below said main surface in said thickness direction of said semiconductor chip,
wherein a lower surface of said first portion of said chip supporting lead is adhered to said main surface of said semiconductor chip by an adhesive, and
wherein an upper surface of said first portion of said chip supporting lead is positioned below an apex of each of said bonding wires.

13. A semiconductor device according to claim 12, wherein said chip supporting lead is not electrically connected to said bonding wires.

14. A semiconductor device according to claim 12, wherein an end of said second portion of said chip supporting lead terminates at a boundary between an inside and an outside of said resin sealing member.

15. A semiconductor device according to claim 14, wherein said second portion of said chip supporting lead has a stepped portion between said side surface of said semiconductor chip and said boundary of said resin sealing member.

16. A semiconductor device according to claim 15, wherein said end of said second portion of said chip supporting lead is positioned at substantially the same level as said inner lead portions of said plurality of leads in said thickness direction of said semiconductor chip.

17. A semiconductor device according to claim 12, wherein said rear surface of said semiconductor chip contacts with said resin sealing member.

18. A semiconductor device according to claim 12, wherein said main surface of said semiconductor chip has a rectangular shape, and wherein said chip supporting lead extends across one of shorter edges of said main surface of said semiconductor chip.

19. A semiconductor device comprising:
a resin sealing member;
a subject to be sealed in said resin sealing member, having a first surface and a second surface opposite to said first surface, said subject having semiconductor elements and bonding pads formed on said first surface;
a plurality of leads, each having an inner lead portion and an outer lead portion which is continuous with said inner lead portion, ends of said inner lead portions being positioned at a periphery of said subject; and a supporting lead for supporting said subject, having a first portion and a second portion which is continuous with said first portion, said first portion of said supporting lead being disposed on said first surface of said subject, said second portion of said supporting lead being outside of said subject, bonding wires electrically connecting said ends of said inner lead portions of said plurality of leads with said bonding pads respectively, wherein said inner lead portions, said bonding wires and said supporting lead are sealed in said resin sealing member, said outer lead portions of said plurality of leads are extended outwardly from said resin sealing member, wherein said ends of said inner lead portions are disposed between said first surface and said second surface of said subject in a thickness direction of said subject such that an upper surface of each of said inner lead portions is positioned below said first surface of said subject in said thickness direction of said subject and such that a lower surface of each of said inner lead portions is positioned above said second surface in said thickness direction of said subject in said thickness direction of said subject, wherein a lower surface of said first portion of said supporting lead is adhered to said first surface of said subject by an adhesive, and wherein an upper surface of said first portion of said supporting lead is positioned below an apex of each of said bonding wires.

20. A semiconductor device according to claim 19, wherein said supporting lead is not electrically connected to said bonding wires.

21. A semiconductor device according to claim 19, wherein an end of said second portion of said supporting lead terminates at a boundary between an inside and an outside of said resin sealing member.

22. A semiconductor device according to claim 21, wherein said second portion of said supporting lead has a stepped portion between a side surface of said subject and said boundary of said resin sealing member.

23. A semiconductor device according to claim 22, wherein said end of said second portion of said supporting lead is positioned at substantially the same level as said inner lead portions of said plurality of leads in said thickness direction of said subject.

24. A semiconductor device according to claim 19, wherein said second surface of said semiconductor chip contacts with said resin sealing member.

25. A semiconductor device according to claim 19, wherein said first surface of said subject has a rectangular shape, and wherein said supporting lead extends across one of shorter edges of said first surface of said subject.

* * * * *